(12) United States Patent
Han et al.

(10) Patent No.: US 9,318,570 B2
(45) Date of Patent: Apr. 19, 2016

(54) SEMICONDUCTOR DEVICE

(71) Applicant: SAMSUNG ELECTRONICS CO., LTD., Suwon-si, Gyeonggi-do (KR)

(72) Inventors: Sang-Il Han, Seoul (KR); Jong-Un Kim, Hwaseong-si (KR); Jun-Soo Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/472,571

(22) Filed: Aug. 29, 2014

(65) Prior Publication Data

US 2015/0171214 A1 Jun. 18, 2015

(30) Foreign Application Priority Data

Dec. 13, 2013 (KR) ........................ 10-2013-0155120

(51) Int. Cl.
| | | |
|---|---|---|
| *H01L 27/00* | (2006.01) | |
| *H01L 29/00* | (2006.01) | |
| *H01L 29/423* | (2006.01) | |
| *H01L 29/78* | (2006.01) | |
| *H01L 29/66* | (2006.01) | |
| *H01L 27/108* | (2006.01) | |

(52) U.S. Cl.
CPC ...... *H01L 29/4236* (2013.01); *H01L 27/10814* (2013.01); *H01L 27/10876* (2013.01); *H01L 27/10888* (2013.01); *H01L 29/66621* (2013.01); *H01L 29/78* (2013.01); *H01L 29/7827* (2013.01)

(58) Field of Classification Search
CPC ................... H01L 27/10876; H01L 27/10891; H01L 29/7827; H01L 29/4236; H01L 20/78; H01L 29/66621; H01L 27/1081; H01L 27/10888
See application file for complete search history.

(56) References Cited

U.S. PATENT DOCUMENTS

| | | | | |
|---|---|---|---|---|
| 4,683,643 A * | 8/1987 | Nakajima et al. | ............. | 438/270 |
| 5,285,093 A * | 2/1994 | Lage et al. | .................... | 257/332 |
| 8,106,435 B2 | 1/2012 | Kim | | |
| 8,981,440 B2 * | 3/2015 | Nakao | ........................... | 257/295 |
| 2011/0169135 A1 * | 7/2011 | Nakao | ........................... | 257/532 |
| 2012/0108057 A1 | 5/2012 | Hwang | | |
| 2012/0132971 A1 | 5/2012 | Mikasa | | |
| 2012/0156869 A1 | 6/2012 | Shin et al. | | |
| 2012/0214297 A1 | 8/2012 | Cho et al. | | |
| 2012/0217576 A1 * | 8/2012 | Yeo | ............................... | 257/330 |
| 2012/0281490 A1 | 11/2012 | Cho | | |

FOREIGN PATENT DOCUMENTS

| | | |
|---|---|---|
| JP | 2012-79931 A | 4/2012 |
| KR | 10-2010-0111468 A | 10/2010 |
| KR | 10-2012-0003742 A | 1/2012 |
| KR | 10-1139464 A | 4/2012 |
| KR | 10-2012-0066772 A | 6/2012 |

* cited by examiner

*Primary Examiner* — Nikolay Yushin

(74) *Attorney, Agent, or Firm* — Lee & Morse, P.C.

(57) ABSTRACT

Provided is a semiconductor device, including a substrate including a device isolation layer and an active region isolated by the device isolation layer; a trench in the active region; a gate electrode filling at least a portion of the trench; a recess in the substrate at one side of the gate electrode, the recess overlapping a portion of the device isolation layer and the active region; and a lower contact plug filling the recess.

21 Claims, 23 Drawing Sheets

SEMICONDUCTOR DEVICE

CROSS-REFERENCE TO RELATED APPLICATION

Korean Patent Application No. 10-2013-0155120, filed on Dec. 13, 2013, in the Korean Intellectual Property Office, and entitled: "Semiconductor Device And Fabricating Method Thereof," is incorporated by reference herein in its entirety.

BACKGROUND

1. Field

Provided is a semiconductor device and a fabricating method thereof.

2. Description of the Related Art

A buried channel array transistor (BCAT), including a gate electrode buried in a trench, may overcome a short channel effect. However, according to how deep the gate electrode is buried in the trench, BCAT characteristics including, for example, gate induced drain leakage (GIDL) and a current amount, may vary.

SUMMARY

Embodiments may be realized by providing a semiconductor device, including a substrate including a device isolation layer and an active region isolated by the device isolation layer; a trench in the active region; a gate electrode filling at least a portion of the trench; a recess in the substrate at one side of the gate electrode, the recess overlapping a portion of the device isolation layer and the active region; and a lower contact plug filling the recess.

A top surface of the lower contact plug and a top surface of the substrate may be coplanar.

The semiconductor device may further include a capping pattern on a top surface of the gate electrode and filling any remaining portion of the trench. The recess may overlap a portion of the capping pattern.

The lower contact plug may contact the trench.

The semiconductor device may further include an upper contact plug on the lower contact plug.

The upper contact plug and the lower contact plug may be different materials.

The lower contact plug may include carbon doped polysilicon and the upper contact plug includes a metal.

The lower contact plug may include carbon doped polysilicon and the upper contact plug includes polysilicon.

Embodiments may be realized by providing a semiconductor device, including a substrate including a device isolation layer and first and second active regions isolated by the device isolation layer; a first trench in the first active region and a second trench in the second active region; a first gate electrode filling at least a portion of the first trench and a second gate electrode filling at least a portion of the second trench; a first recess in the substrate at one side of the first gate electrode, the first recess overlapping a portion of the device isolation layer and the first active region; a second recess in the substrate at one side of the second gate electrode, the second recess overlapping a portion of the device isolation layer and the second active region; a first lower contact plug filling the first recess; and a second lower contact plug filling the second recess and separated from the first lower contact plug.

A portion of the device isolation layer may be interposed between the first lower contact plug and the second lower contact plug.

A top surface of the first lower contact plug, a top surface of the second lower contact plug and a top surface of the substrate may be coplanar.

The first lower contact plug may contact the first trench and the second lower contact plug contacts the second trench.

The semiconductor device may further include a third trench in the device isolation layer; and a conductive material filling a portion of the third trench. At least one of the first lower contact plug and the second lower contact plug may overlap with the conductive material.

The semiconductor device may further include an interlayer dielectric film on the substrate; a first contact hole passing through the interlayer dielectric film and exposing the first lower contact plug and a second contact hole passing through the interlayer dielectric film and exposing the second lower contact plug; and a first upper contact plug in the first contact hole and a second upper contact plug in the second contact hole.

The first upper contact plugs and the first lower contact plugs may be different materials; and the second upper contact plugs and the second lower contact plugs may be different materials.

Embodiments may be realized by providing a semiconductor device, including a substrate including a device isolation layer and an adjacent source/drain region of an active region; a recess in a portion of the device isolation layer and the source/drain region; a lower contact plug filling the recess; and a storage node overlapping a portion of the lower contact plug.

The semiconductor device may include a trench in the active region, the recess being at one side of the trench; and a gate insulation layer in the trench.

The lower contact plug may overlap a portion of the gate insulation layer.

The lower contact plug may overlap all of the gate insulation layer.

The semiconductor device may further include a gate electrode filling a portion of the trench; and a capping pattern on a top surface of the gate electrode and filling a remaining portion of the trench, the lower contact plug overlapping a portion of the capping pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
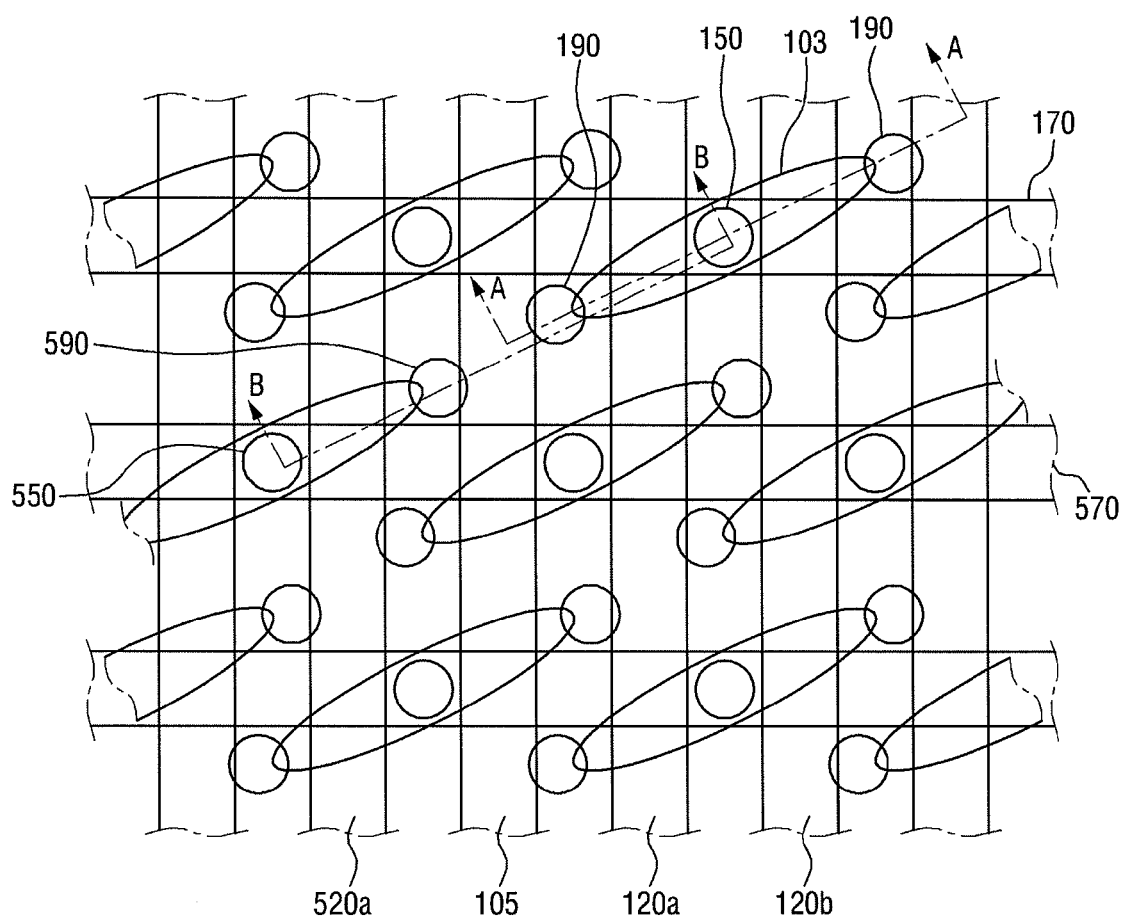
FIG. 1 illustrates a layout view for explaining semiconductor devices according to embodiments.
Figure 1:
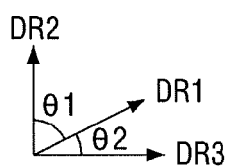

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A layout of semiconductor devices according to embodiments will be described with reference to FIG. 1.

FIG. 1 illustrates a layout view for explaining semiconductor devices according to embodiments.

Referring to FIG. 1, a first active region 103 may be defined by forming a device isolation region 105 in a substrate 100. The first active region 103 may extend in a first direction, gate electrodes (e.g., word lines) 120a and 120b may extend in a second direction DR2 and may form an acute angle with the first direction DR1, and bit lines 170 and 570 may extend in a third direction DR3 and may form an acute angle with the first direction DR1.

When reference is made to, for example, two directions forming a "predetermined angle," the term "angle" means a smaller angle of two angles formed by two directions crossing each other, for example, 60° when angles formed by two directions cross each other are 120° and 60°. As shown in FIG. 1, the angle formed by the first direction DR1 and the second direction DR2 is θ1, and the angle formed by the first direction DR1 and the third direction DR3 is θ2.

As described above, θ1 and/or θ2 being acute angles may provide a maximum distance between the first bit line contact 150 connecting the first active region 103 to the first bit line 170 and a first upper contact plug 190 connecting the first active region 103 to a capacitor (not shown). For example, θ1 and θ2 may be 45° and 45°, 30° and 60° or 60° and 30°.

A semiconductor device according to a first embodiment will now be described with reference to FIGS. 2 and 3.

Figure 2:
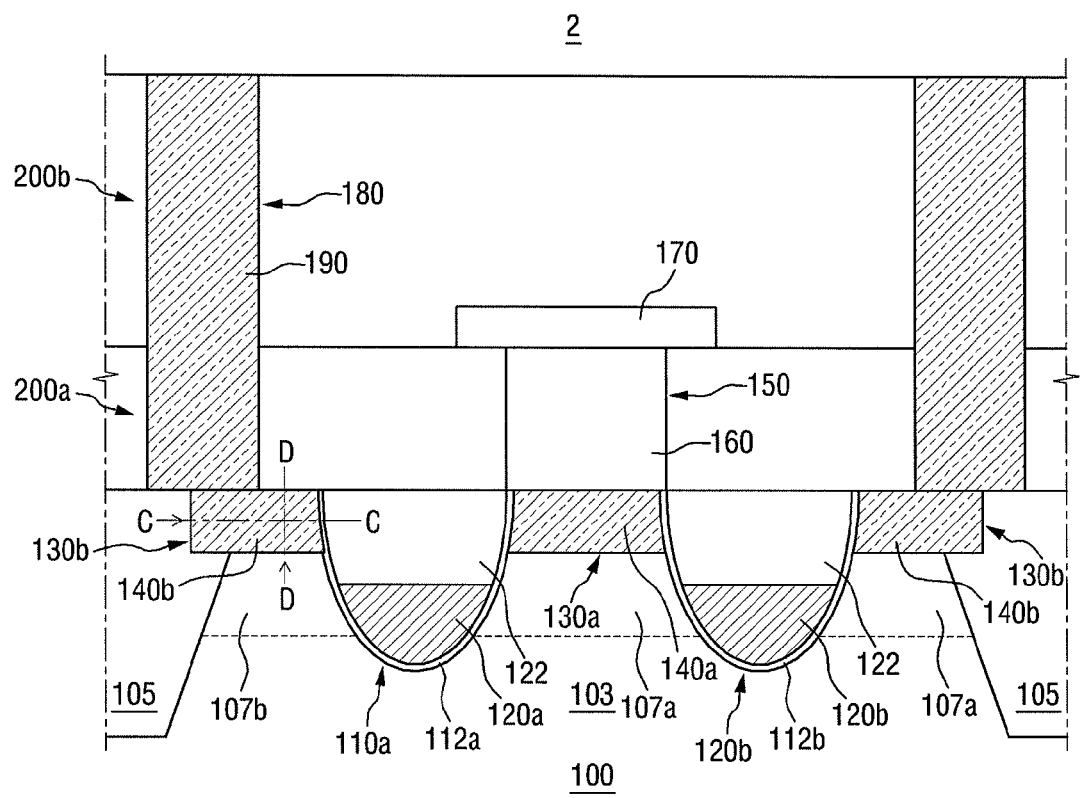
FIGS. 2 and 3 illustrate cross-sectional views of a semiconductor device according to a first embodiment.
Figure 3:
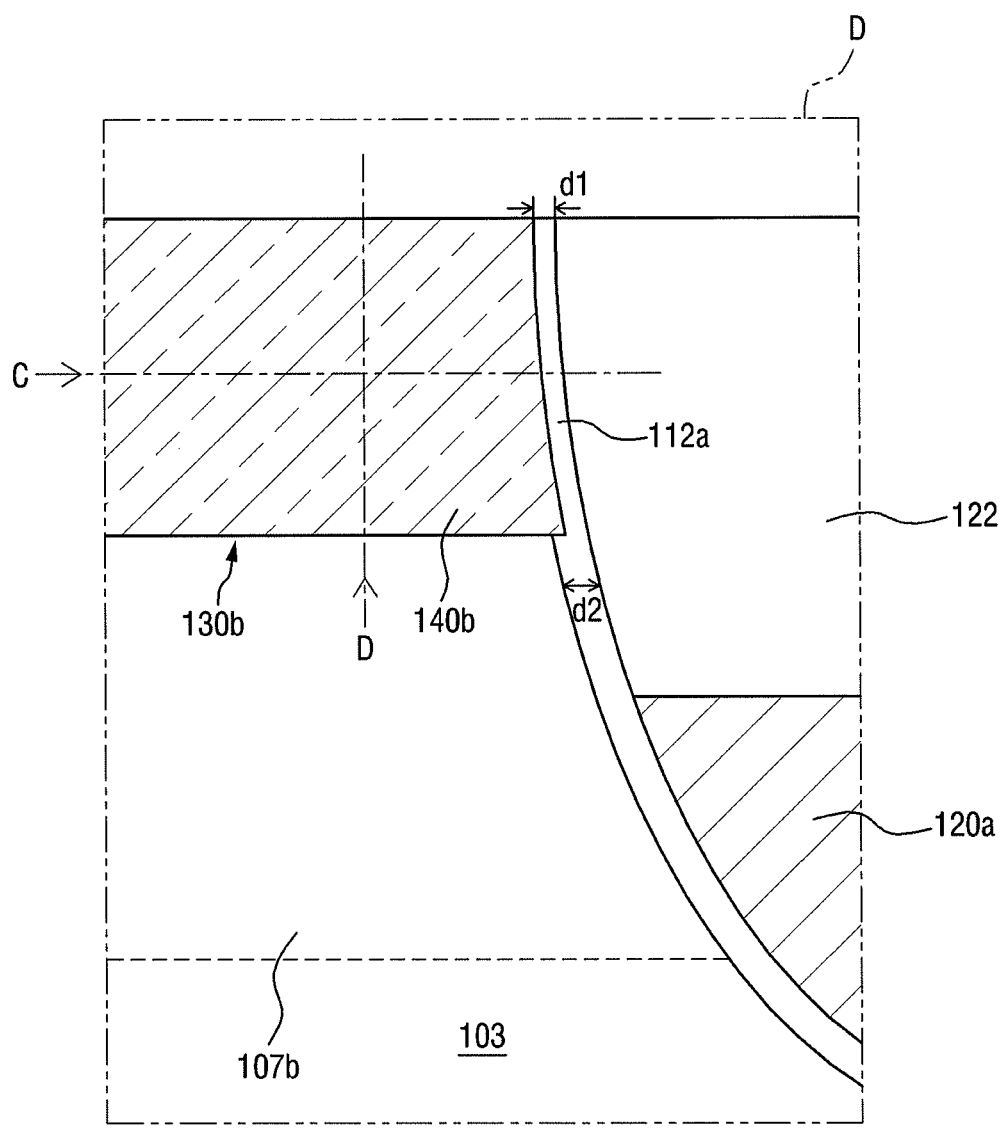

FIGS. 2 and 3 illustrate cross-sectional views of a semiconductor device according to a first embodiment.

FIG. 2 is a cross-sectional view taken along line A-A of FIG. 1 and FIG. 3 is an enlarged cross-sectional view illustrating a portion of FIG. 2.

Referring to FIG. 2, the semiconductor device 1 according to a first embodiment may include a substrate 100, a first active region 103, a device isolation layer 105, a first trench 110a, a second trench 110b, a first gate electrode 120a, a second gate electrode 120b, a first recess 130a, a second recess 130b, a first lower contact plug 140a, a second lower contact plug 140b and a first upper contact plug 190.

In an embodiment, the substrate 100 may have a structure in which a base substrate and an epitaxial layer are stacked. The substrate 100 may be, for example, a silicon substrate, a gallium arsenide substrate, a silicon germanium, a ceramic substrate, a quartz substrate or a glass substrate for display. In an implementation, the substrate 100 may be a silicon on insulator (SOI) substrate. In the following description, a silicon substrate will be described by way of example.

The device isolation layer 105 may be formed in the substrate 100 to define the first active region 103. In an embodiment, the device isolation layer 105 may be formed as a shallow trench isolation (STI) having a good device isolating characteristic and occupying a small area, which may be advantageous in achieving high integration. The device isolation layer 105 may include, for example, at least one of silicon oxide, silicon nitride, silicon oxynitride and a combination thereof.

The first trench 110a and the second trench 110b may be formed in the substrate 100 of the first active region 103. The first trench 110a and the second trench 110b may have various shapes. For example, as shown, each of the first trench 110a and the second trench 110b may be round at connection parts between its bottom surface and sidewalls. In an implementation, the sidewalls of the first trench 110a and the second trench 110b may be tilted with a predetermined angle.

The first and second gate insulation layers 112a and 112b may be formed along the first and second trenches 110a and 110b. The first and second gate insulation layers 112a and 112b may include, for example, at least one of silicon oxide, silicon nitride, silicon oxynitride and a high-k dielectric material. The high-k layer may be made of, for example, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate electrode 120a may be formed by filling at least a portion of the first trench 110a having the first gate insulation layer 112a. The second gate electrode 120b may be formed by filling at least a portion of the second trench 110b having the second gate insulation layer 112b. The first gate electrode 120a and the second gate electrode 120b may be recessed. Top surfaces of the first gate electrode 120a and the second gate electrode 120b may be lower than a (top) surface of the substrate 100. The first gate electrode 120a and the second gate electrode 120b may include a conductive material, for example, a metal or polysilicon.

The first capping pattern 122 may be formed by filling the remaining portions of the first trench 110a and the second trench 110b having the first gate electrode 120a and the second gate electrode 120b. The first capping pattern 122 may include, for example, at least one of silicon oxide, silicon nitride and silicon oxynitride.

A first source/drain 107a may be formed between the first gate electrode 120a and the second gate electrode 120b, and a second source/drain 107b may be formed between the first gate electrode 120a and the device isolation layer 105 and between the second gate electrode 120b and the device isolation layer 105. Two transistors may be formed in the first active region 103. The first source/drain 107a may be shared by two adjacent transistors, while the second source/drain 107b may not be shared by two adjacent transistors. A first recess 130a may be formed between the first gate electrode 120a and the second gate electrode 120b. The first recess 130a may be formed in the first source/drain 107a. The second recess 130b may be formed between each of the first gate electrode 120a and the second gate electrode 120b and the device isolation layer 105. The second recess 130b may be formed at one side of each of the first gate electrode 120a and the second gate electrode 120b along (i.e., overlapping) a portion of the device isolation layer 105 and the first active region 103. The first recess 130a and the second recess 130b may be formed to overlap with the first source/drain 107a and the second source/drain 107b. One sidewall of the second recess 130b may be the first gate insulation layer 112a or the second gate insulation layer 112b. The other sidewall of the second recess 130b may be the device isolation layer 105.

The first lower contact plug 140a may be formed by filling a conductive material in the first recess 130. The second lower contact plug 140b may be formed by filling a conductive material in the second recess 130b. The first lower contact plug 140a and the second lower contact plug 140b may include, for example, at least one of polysilicon, a metal silicide compound, conductive metal nitride, and a metal. In the following description of the semiconductor device 1 according to a first embodiment, it is assumed that the first lower contact plug 140a and the second lower contact plug 140b include polysilicon.

In addition, the first lower contact plug 140a and the second lower contact plug 140b may include carbon. If the first lower contact plug 140a and the second lower contact plug 140b include carbon, they may prevent impurities from being diffused to the source/drain regions 107a and 107b, and the reliability of the semiconductor device 1 according to a first embodiment may be improved. When the first lower contact plug 140a and the second lower contact plug 140b include phosphorus (P) doped polysilicon, the reliability of the semiconductor device 1 according to a first embodiment may be deteriorated if P is diffused. In order to prevent phosphorus (P) from being diffused, various methods may be used. For example, the diffusion of phosphorus (P) may be prevented by using carbon (C) doped polysilicon, instead of phosphorus (P) doped polysilicon.

In an embodiment of depositing carbon (C) doped polysilicon, a first seed layer of carbon (C) doped polysilicon may first be deposited on bottom surfaces and sidewalls of the first recess 130a and the second recess 130b, and a second seed layer of carbon (C) doped polysilicon may then be deposited. The first seed layer may have a higher carbon concentration than the second seed layer, and carbon concentrations of surfaces of the first lower contact plug 140a and the second lower contact plug 140b may be reduced away from the surfaces. For example, the carbon concentration may decrease and then may increase along line C-C. In addition, the carbon concentration may gradually decrease and then may be maintained at a constant value from a particular part upwardly along line D-D.

Top surfaces of the first lower contact plug 140a and the second lower contact plug 140b may be planarized planes. The top surfaces of the first lower contact plug 140a and the second lower contact plug 140b may be positioned to be coplanar with the top surface of the device isolation layer 105. As used herein, the term "coplanar" may encompass a small step difference between the top surfaces of the first lower contact plug 140a and the second lower contact plug 140b and the top surface of the device isolation layer 105.

The first lower contact plug 140a and the second lower contact plug 140b may make contact with the first trench 110a or the second trench 110b. For example, the first lower contact plug 140a and the second lower contact plug 140b may make contact with one of the first and the second gate insulation layers 112a and 112b.

The first lower contact plug 140a may overlap with a portion of the first gate insulation layer 112a or the second gate insulation layer 112b. The second lower contact plug 140b may overlap with a portion of the first gate insulation layer 112a or the second gate insulation layer 112b. For example, a width d1 of the first gate insulation layer 112a overlapping with the second lower contact plug 140b may be smaller than a width d2 of the first gate insulation layer 112a not overlapping with the second lower contact plug 140b. The same applies to the second gate insulation layer 112b.

The first interlayer dielectric film 200a may be formed on the substrate 100 to cover the first gate electrode 120a, the second gate electrode 120b and the device isolation layer 105. The first interlayer dielectric film 200a may include, for example, at least one of silicon oxide, silicon nitride and silicon oxynitride. The first interlayer dielectric film 200a may include a single layer or multiple layers.

The first interlayer dielectric film 200a may include a first contact hole 150 exposing the first lower contact plug 140a.

A first bit line contact 160 may be formed in the first contact hole 150. The first bit line contact 160 may include a conductive material. The first bit line contact 160 may include, for example, at least one of polysilicon, a metal silicide compound, conductive metal nitride, and a metal.

A first bit line 170 electrically connected to the first bit line contact 160 may be formed on the first bit line contact 160. The first bit line 170 may include, for example, at least one of polysilicon, a metal silicide compound, conductive metal nitride, and a metal.

The second interlayer dielectric film 200b may be formed on the first interlayer dielectric film 200a to cover the first bit line 170. The second interlayer dielectric film 200b may include, for example, at least one of silicon oxide, silicon nitride, and silicon oxynitride. The second interlayer dielectric film 200b may include a single layer or multiple layers.

The second contact hole 180 may pass through the first interlayer dielectric film 200a and the second interlayer dielectric film 200b, and may then expose the second lower contact plug 140b.

A first upper contact plug 190 may be formed in the second contact hole 180. The first upper contact plug 190 may be electrically connected to the second lower contact plug 140b. The first upper contact plug 190 may include a conductive material. The first upper contact plug 190 may include, for example, at least one of polysilicon, a metal silicide compound, conductive metal nitride, and a metal.

The first upper lower contact plug 140b and the second lower contact plug 190 may be formed to be electrically connected to the second source/drain 107b.

In general, a contact plug that is not divided into an upper part and a lower part may be formed to overlap with a source/drain. Such a contact plug may be misaligned due to a processing reason, and the reliability of such a semiconductor device may be deteriorated.

In the semiconductor device 1 according to a first embodiment, the second lower contact plug 140b may be formed on the second source/drain 107b. The second lower contact plug 140b may be formed along a portion of the device isolation layer 105 as well as on the second source/drain 107b. Even if the first upper contact plug 190 is misaligned, it may nonetheless be electrically connected, and the reliability of the semiconductor device 1 according to a first embodiment may be improved. In an embodiment illustrated in FIG. 2, the first upper contact plug 190 may lean toward the device isolation layer 105.

The contact plugs 190 and 140b may be formed to be divided into upper and lower parts, and generation of voids may be prevented, as compared to a case of forming an undivided contact plug through a single process. The voids are empty spaces that may be created when a conformal substance is inserted into the contact hole, and may also be called air gaps. If an undivided contact plug is formed and voids are generated, resistance of the contact plug may increase and the reliability of the semiconductor device may be deteriorated. In the semiconductor device 1 according to a first embodiment, upper and lower contact plugs may be separately formed, the voids may be prevented from being generated, and the reliability may be improved.

An information storage element formed on the upper contact plug may be, for example, a capacitor, and may include a storage node contacting the first upper contact plug 190. In an implementation, the information storage element may be a variable resistor, for example, a variable resistor including a phase change material, or a magnetic tunnel junction pattern.

In the semiconductor device 1 according to a first embodiment, the second lower contact plug 140b and the first upper contact plug 190 may include the same material, for example, polysilicon. The second lower contact plug 140b may include carbon while the first upper contact plug 190 may include carbon undoped polysilicon.

A semiconductor device according to a second embodiment will now be described with reference to FIG. 4. The second embodiment is substantially the same with the first embodiment, except for a material for forming a first upper contact plug 190. In the following description, the same or corresponding parts as those of the first embodiment will be briefly described or omitted.

Figure 4:
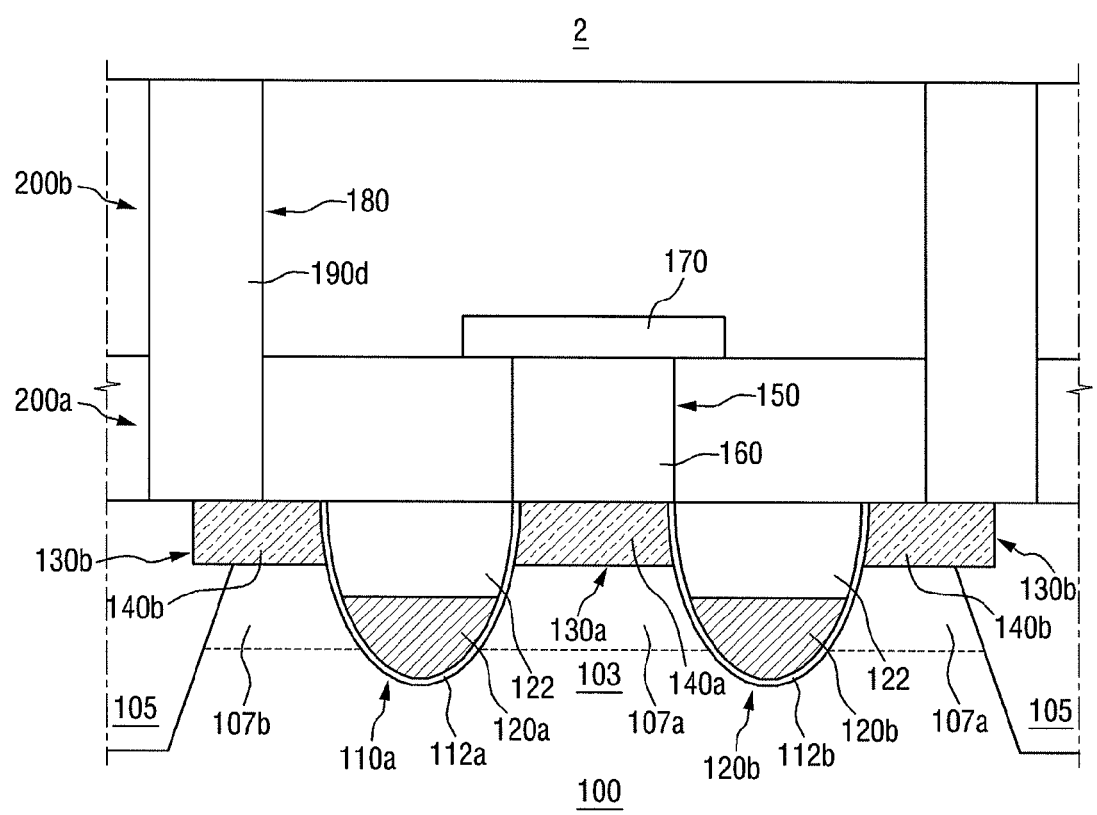
FIG. 4 illustrates a cross-sectional view of a semiconductor device according to a second embodiment.

FIG. 4 illustrates a cross-sectional view of a semiconductor device according to a second embodiment.

A second upper contact plug 190d and a second lower contact plug 140b may be made of different materials. The second lower contact plug 140b may include carbon doped polysilicon, phosphorus (P) may be prevented from being diffused, and the reliability of the semiconductor device 2 may be improved. The second upper contact plug 190d may be formed of a metal, and the resistance of the contact plug may be reduced. The contact plug may be divided into upper and lower parts, and the semiconductor device 2 capable of selectively improving various functions may be provided.

A semiconductor device 3 according to a third embodiment will now be described with reference to FIG. 5. The third embodiment is substantially the same with the second embodiment, except for shapes of a first lower contact plug 140a and a second lower contact plug 140b. In the following description, the same or corresponding parts as those of the first embodiment will be briefly described or omitted.

Figure 5:
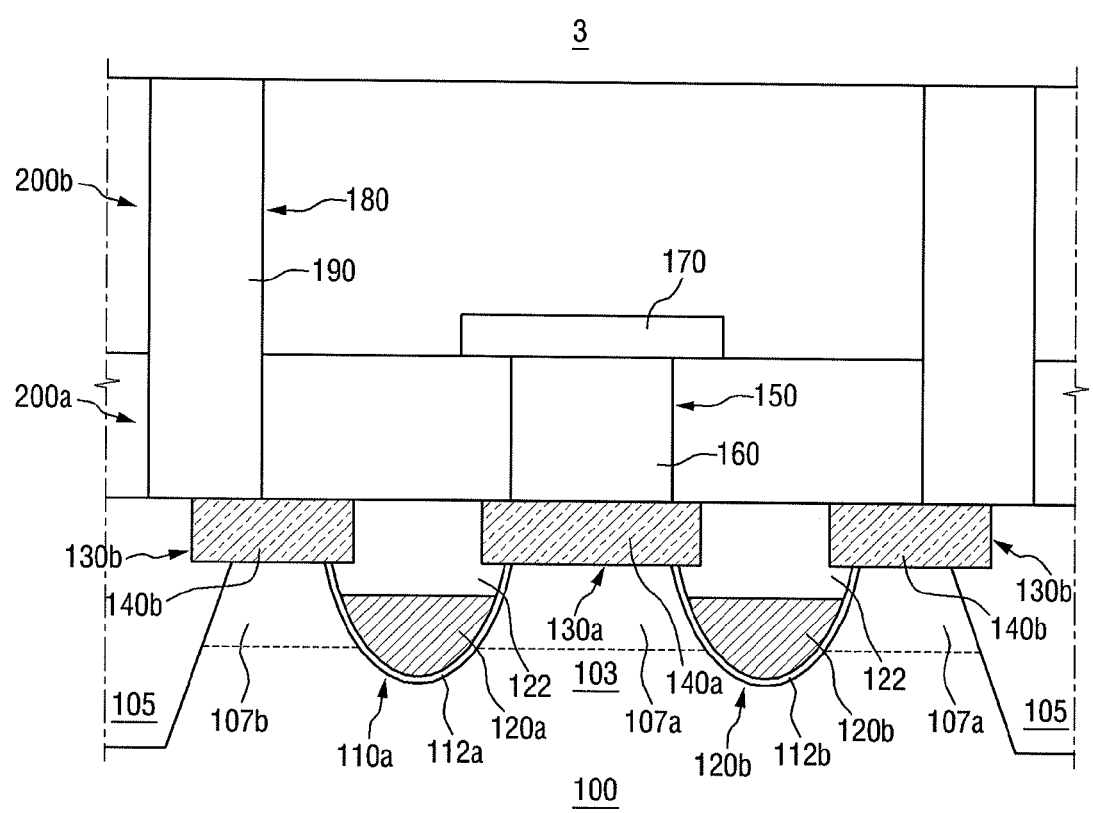
FIG. 5 illustrates a cross-sectional view of a semiconductor device according to a third embodiment.

FIG. 5 illustrates a cross-sectional view of a semiconductor device according to a third embodiment. FIG. 5 is a cross-sectional view taken along line A-A of FIG. 1.

Referring to FIG. 5, the second lower contact plug 140b may make contact with the first capping pattern 122. The second lower contact plug 140b may not make contact with the first gate electrode 120a or the second gate electrode 120b. If the first and second gate electrodes 120a and 120b used as word lines are connected to the second lower contact plug 140b, the semiconductor device may operate abnormally. A bottom surface of the second lower contact plug 140b may be higher than top surfaces of the first gate electrode 120a and the second gate electrode 120b. The second lower contact plug 140b may not make contact with the first gate electrode 120a or the second gate electrode 120b while making contact with the first capping pattern 122.

The top surface of the second lower contact plug 140b may be increased, and even if the first upper contact plug 190 is misaligned, a sufficient contact area between the second lower contact plug 140b and the first upper contact plug 190 may be secured, and the reliability of the semiconductor device 3 according to the third embodiment may not be deteriorated.

A semiconductor device 4 according to a fourth embodiment will now be described with reference to FIG. 6.

Figure 6:
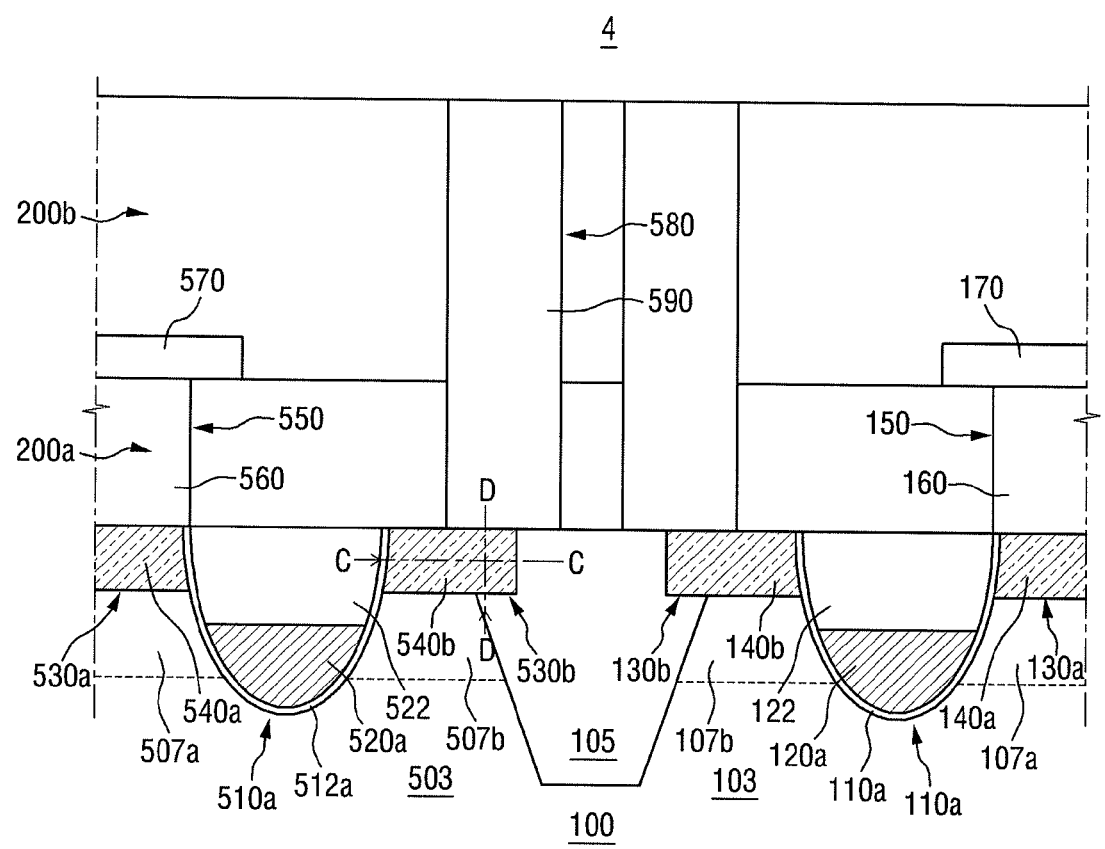
FIG. 6 illustrates a cross-sectional view of a semiconductor device according to a fourth embodiment.

FIG. 6 illustrates a cross-sectional view of a semiconductor device according to a fourth embodiment. FIG. 6 is a cross-sectional view taken along line B-B of FIG. 1.

Referring to FIG. 6, the semiconductor device 4 according to the fourth embodiment may include a substrate 100, a first active region 103, a second active region 503, a device isolation layer 105, a first trench 110a, a third trench 510a, a first gate electrode 120a, a third gate electrode 520a, a second recess 130b, a fourth recess 530b, a second lower contact plug 140b, a fourth lower contact plug 540b and a third upper contact plug 590.

The first trench 110a may be formed in the substrate 100 of the first active region 103 and the third trench 510a may be formed in the second active region 503. The third trench 510a may have various shapes. For example, as shown, the third trench 510a may be round at connection parts between its bottom surface and sidewalls. In an implementation, the sidewalls of the third trench 510a may be tilted with a predetermined angle.

The first gate insulation layer 112a may be formed along the first trench 110a. The third gate insulation layer 512a may be formed along the third trench 510a. The third gate insulation layer 512a may include, for example, at least one of silicon oxide, silicon nitride, silicon oxynitride and a high-k dielectric material. The high-k dielectric material may be the same as described above with regard to the first gate insulation layer 112a, and a repeated description thereof will be omitted.

The first gate electrode 120a may be formed by filling at least a portion of the first trench 110a having the first gate insulation layer 112a. The third gate electrode 520a may be formed by filling at least a portion of the third trench 510a having the third gate insulation layer 512a. The third gate electrode 520a may be recessed. A top surface of the third gate electrode 520a may be lower than a (top) surface of the substrate 100. The third gate electrode 520a may include a conductive material, for example, a metal or polysilicon.

The first capping pattern 122 may be formed by filling the remaining portion of the first trench 110a having the first gate electrode 120a. The second capping pattern 522 may be formed by filling the remaining portion of the third trench 510a having the third gate electrode 520a. The second capping pattern 522 may include, for example, at least one of silicon oxide, silicon nitride and silicon oxynitride.

The second source/drain 107b may be formed between the first gate electrode 120a and the device isolation layer 105. The first source/drain 107a may be formed at the other side of the first gate electrode 120a. The fourth source/drain region 507b may be formed between the third gate electrode 520a and the device isolation layer 105. The fourth source/drain region 507b may be formed at one side of the third gate electrode 520a. The third source/drain region 507a may be formed at the other side of the third gate electrode 520a.

The fourth source/drain region 507b and the second source/drain 107b may be formed at opposite sides of the device isolation layer 105. In addition, the third source/drain region 507a and the first source/drain 107a may be formed at opposite sides of the device isolation layer 105.

The fourth recess 530b may be formed at one side of the third gate electrode 520a, and may then extend up to a portion of the device isolation layer 105.

The third recess 530a may be formed in the third source/drain region 507a at one side of the third gate electrode 520a. The fourth recess 530b and the second recess 130b may be formed at opposite sides of the device isolation layer 105. The third recess 530a and the first recess 130a may be formed at opposite sides of the device isolation layer 105.

Both of the fourth recess 530b and the second recess 130b may be formed to overlap the device isolation layer 105 while being separated from each other.

The first lower contact plug 140a may be formed by filling the first recess 130 with a conductive material. The second lower contact plug 140b may be formed by filling the second recess 130b with a conductive material. The third lower contact plug 540a may be formed by filling the third recess 530a with a conductive material. The fourth lower contact plug 540b may be formed by filling the fourth recess 530b with a conductive material. The third lower contact plug 540a and the fourth lower contact plug 540b may include, for example, at least one of polysilicon, a metal silicide compound, conductive metal nitride, and a metal. In the following description of the semiconductor device 4 according to the fourth embodiment, it is assumed that the third lower contact plug 540a and the fourth lower contact plug 540b include polysilicon.

In the semiconductor device 4 according to the fourth embodiment, the second lower contact plug 140b and the fourth lower contact plug 540b may include the same material.

The fourth lower contact plug 540b may include carbon. The fourth lower contact plug 540b may include carbon, impurity diffusion may be prevented, and the reliability of the semiconductor device may be improved. Carbon concentrations of a surface of the fourth lower contact plug 540b may be reduced away from the surface. The carbon concentration may decrease and then increase along line E-E. In addition, the carbon concentration may gradually decrease and then may be maintained at a constant value from a particular part upwardly along line F-F.

Top surfaces of the first lower contact plug 140a, the second lower contact plug 140b, the third lower contact plug 540a and the fourth lower contact plug 540b may be planarized planes. The top surfaces of the first lower contact plug 140a and the second lower contact plug 140b may be positioned to be coplanar with the top surface of the device isolation layer 105.

The third lower contact plug 540a and the fourth lower contact plug 540b may make contact with the third trench 510a. The third lower contact plug 540a and/or the fourth lower contact plug 540b may make contact with one of the third gate insulation layer 512a and the second capping pattern 522. The fourth lower contact plug 540b may overlap with a portion of the third gate insulation layer 512a.

For example, a width d1 of the third gate insulation layer 512a overlapping with the fourth lower contact plug 540b may be smaller than a width d2 of the third gate insulation layer 512a not overlapping with the fourth lower contact plug 540b. The fourth lower contact plug 540b may contact the second capping pattern 522. However, the fourth lower contact plug 540b may not contact the third gate electrode 520a. If the first and second gate electrodes 120a and 120b used as word lines are connected to the second lower contact plug 140b, the semiconductor device may operate abnormally. A bottom surface of the fourth lower contact plug 540b may be higher than a top surface of the third gate electrode 520a, and the fourth lower contact plug 540b may not make contact with the third gate electrode 520a while making contact with the second capping pattern 522.

A first interlayer dielectric film 200a may be formed on the substrate 100 to cover the first trench 110a, the third trench 510a and the device isolation layer 105. The first interlayer dielectric film 200a may include a third contact hole 550 exposing the third lower contact plug 540a. A second bit line contact 560 may be formed in the third contact hole 550. The second bit line contact 560 may include a conductive material. The first bit line contact 160 may include, for example, at least one of polysilicon, a metal silicide compound, conductive metal nitride, and a metal.

In the semiconductor device 4 according to the fourth embodiment, the first bit line contact 160 and the second bit line contact 560 may include the same material. In addition, the first bit line 170 and the second bit line 570 may also include the same material.

The second bit line 570 electrically connected to the second bit line contact 560 may be formed on the second bit line contact 560.

A fourth contact hole 580 may pass through the first interlayer dielectric film 200a and the second interlayer dielectric film 200b and may expose the fourth lower contact plug 540b.

A third upper contact plug 590 may be formed in the fourth contact hole 580. The third upper contact plug 590 may be electrically connected to the fourth lower contact plug 540b. The third upper contact plug 590 may include a conductive material. For example, the third upper contact plug 590 may include at least one of polysilicon, a metal silicide compound, conductive metal nitride, and a metal.

The third upper contact plug 590 and the fourth lower contact plug 540b may be formed for the purpose of electrically connecting the fourth source/drain region 507b. In the semiconductor device 4 according to the fourth embodiment, the fourth lower contact plug 540b may be formed on the fourth source/drain region 507b. The fourth lower contact plug 540b may be formed along a portion of the device isolation layer 105 as well as on the fourth source/drain region 507b. Further, the fourth lower contact plug 540b may be formed to overlap with the third gate insulation layer 512a and may be formed in a portion of the second capping pattern 522b. In an embodiment illustrated in FIG. 6, the third upper contact plug 590 and the first upper contact plug 190 may lean toward the device isolation layer 105.

In the semiconductor device 4 according to the fourth embodiment, the fourth lower contact plug 540b and the third upper contact plug 590 may include the same material. The second lower contact plug 140b and the first upper contact plug 190 may also include the same material. The third upper contact plug 590 and the first upper contact plug 190 may include polysilicon. The third upper contact plug 590 and the first upper contact plug 190 may include carbon while the first upper contact plug 190 may include carbon undoped polysilicon.

A semiconductor device 5 according to a fifth embodiment will now be described with reference to FIG. 7.

The fifth embodiment is substantially the same with the fourth embodiment, except for a material for forming a fourth trench 551. In the following description, the same or corresponding parts as those of the first embodiment will be briefly described or omitted.

Figure 7:
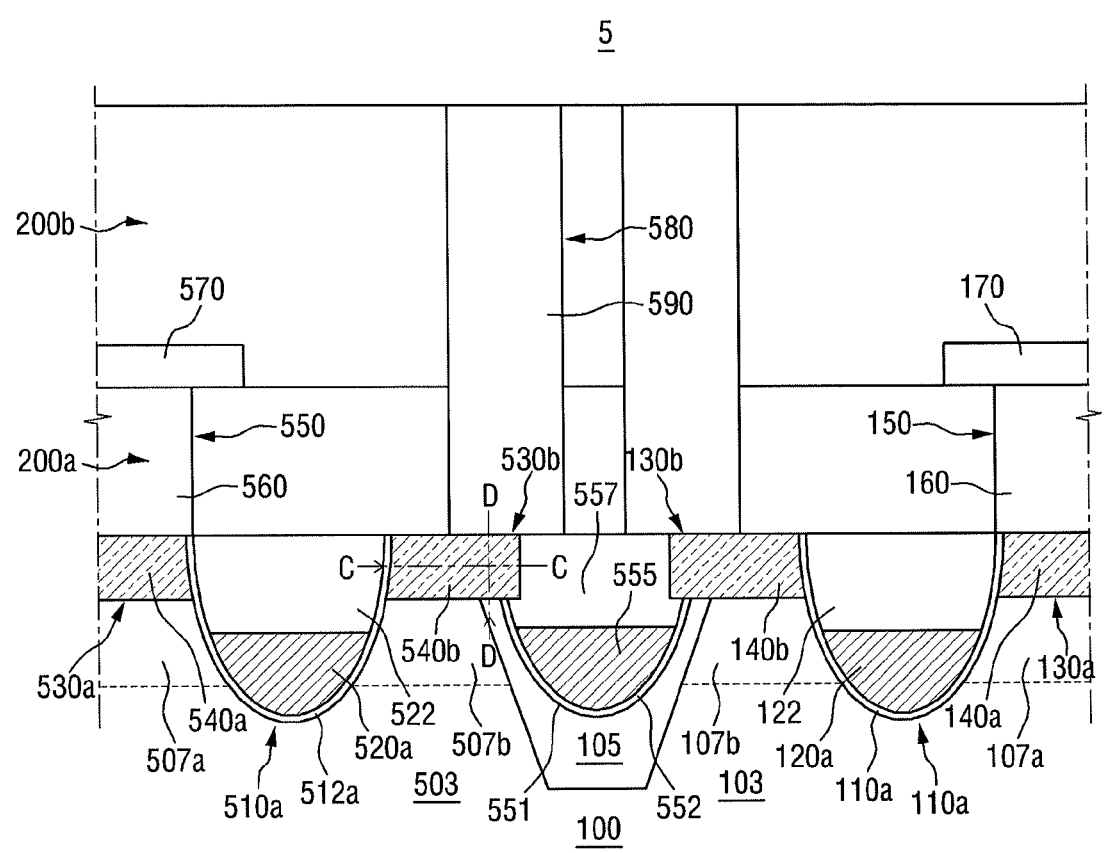
FIG. 7 illustrates a cross-sectional view of a semiconductor device according to a fifth embodiment.

FIG. 7 illustrates a cross-sectional view of a semiconductor device according to a fifth embodiment.

The fourth trench 551 may be formed in a device isolation layer 105. A fourth gate insulation layer 552 may be conformally formed on sidewalls of the fourth trench 551. A conductive material 555 may fill at least a portion of the fourth trench 551. A third capping pattern 557 may be formed by filling the remaining portion of the fourth trench 551. The fourth trench 551 may not be used as a gate of a transistor. The conductive material 555 may be formed in the device isolation layer 105 but may be used as a word line in another active region.

At least one of a fourth lower contact plug 540b and a second lower contact plug 140b may overlap with the conductive material 555, while not making contact with the conductive material 555. At least one of the fourth lower contact plug 540b and the second lower contact plug 140b may make contact with the conductive material 555, and the fourth lower contact plug 540b or the second lower contact plug 140b may be connected to another gate electrode through a word line. The larger the top surfaces of the fourth lower contact plug 540b and the second lower contact plug 140b, the more easily the third upper contact plug 590 and the first upper contact plug 190 may be electrically connected to each other. It may be possible to prevent a deterioration in the reliability of the semiconductor device 5 according to the fifth embodiment due to misalignment occurring when the third upper contact plug 590 and the first upper contact plug 190 are formed.

Next, a fabricating method of the semiconductor device according to the first embodiment will be described with reference to FIGS. 8 to 28.

Figure 8:
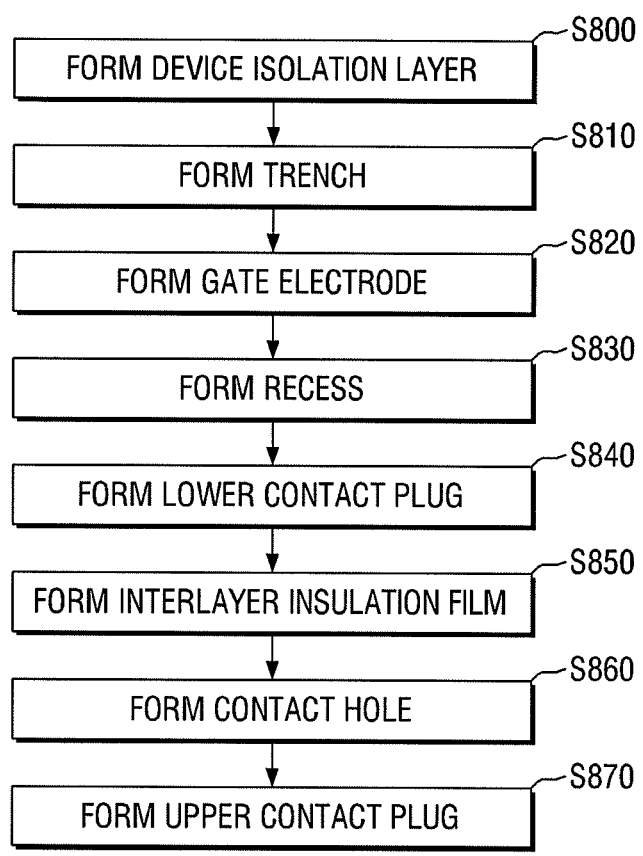
FIG. 8 illustrates a flowchart illustrating for explaining a fabricating method of the semiconductor device according to the first embodiment.

FIG. 8 illustrates a flowchart illustrating for explaining a fabricating method of the semiconductor device according to the first embodiment, and FIGS. 9 to 28 illustrate intermediate process steps for explaining the fabricating method of the semiconductor device according to the first embodiment.

Figure 9:
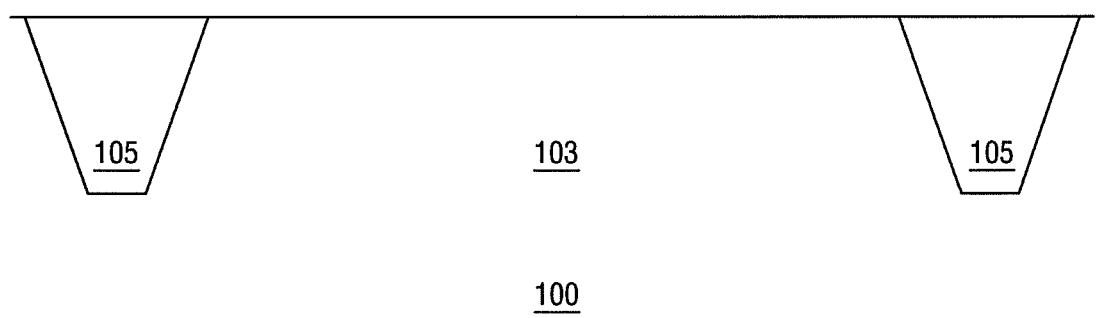
FIGS. 9 to 28 illustrate intermediate process steps for explaining the fabricating method of the semiconductor device according to the first embodiment.

Referring to FIGS. 8 and 9, the device isolation layer 105 may be formed on the substrate 100 (S800).

The substrate 100 may have a structure in which a base substrate and an epitaxial layer are stacked. The substrate 100 may be a silicon substrate, a gallium arsenide substrate, a silicon germanium, a ceramic substrate, a quartz substrate or a glass substrate for display. In an implementation, the substrate 100 may be a silicon on insulator (SOI) substrate. In the following description, a silicon substrate will be described.

The device isolation layer 105 may be formed in the substrate 100 to define the first active region 103. The first active region 103 may be defined by the device isolation layer 105, such as a shallow trench isolation (STI) layer.

Figure 10:
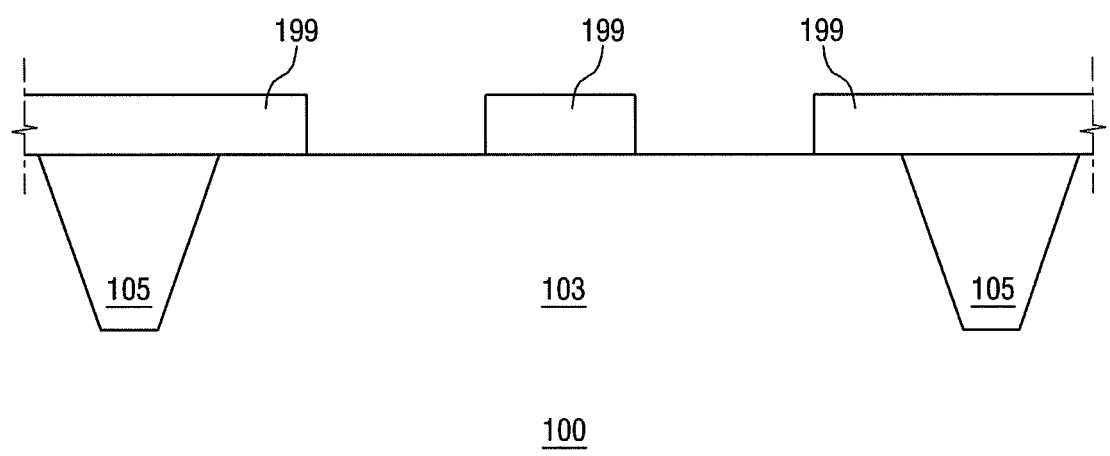

Next, referring to FIGS. 8 and 10, a mask pattern 199 may be formed on the substrate 100.

The mask pattern 199 exposes regions where the first trench 110a and the second trench 110b may be formed. The mask pattern 199 may be, for example, an oxide film, a nitride film or an oxynitride film.

Figure 11:
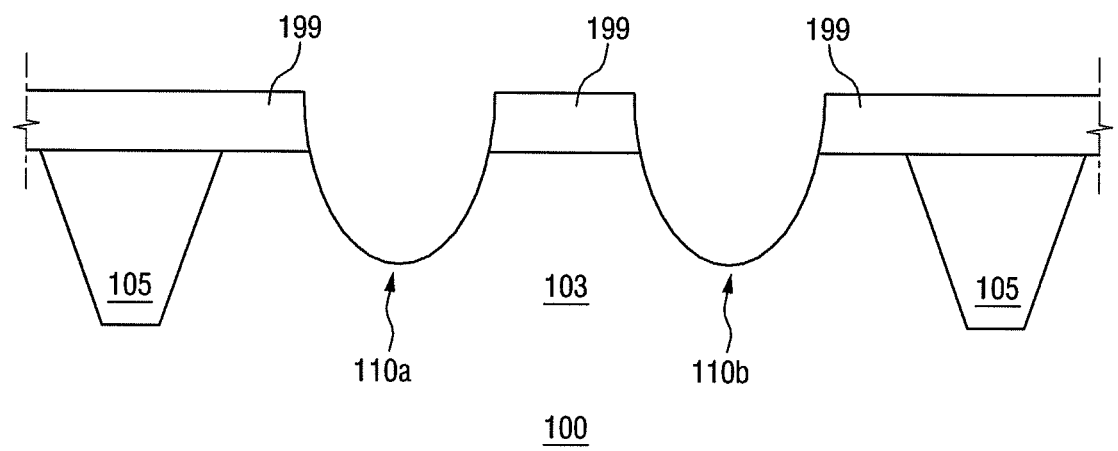

Referring to FIGS. 8 and 11, the first trench 110a and the second trench 110b may be formed at a portion where the mask pattern 199 is not formed (S810). A trench may be additionally formed in the device isolation layer 105.

The first trench 110a and the second trench 110b may have various shapes. For example, as shown, the first trench 110a and the second trench 110b may be round at connection parts between its bottom surface and sidewalls. In an implementation, the sidewalls of the first trench 110a and the second trench 110b may be tilted with a predetermined angle.

Figure 12:
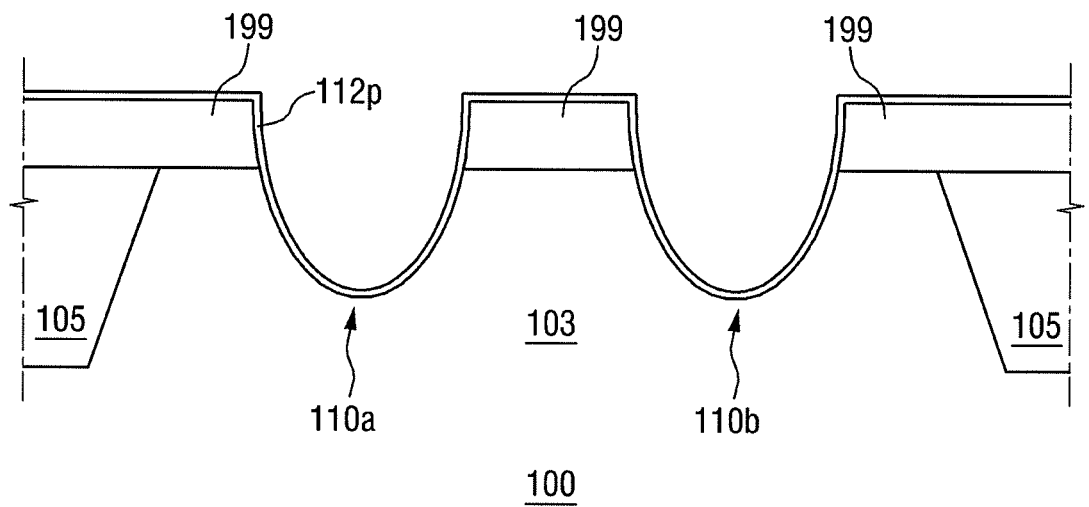

Referring to FIGS. 8 and 12, an insulation layer 112p may be formed on top surfaces of the first trench 110a and the second trench 110b and a top surface of the mask pattern 199.

The insulation layer 112p may be formed in the first trench 110a and the second trench 110b, and may be conformally formed on the top surface of the mask pattern 199. The insulation layer 112p may include, for example, at least one of silicon oxide, silicon nitride, silicon oxynitride and a high-k dielectric material. The high-k layer may be made of, for example, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 13:
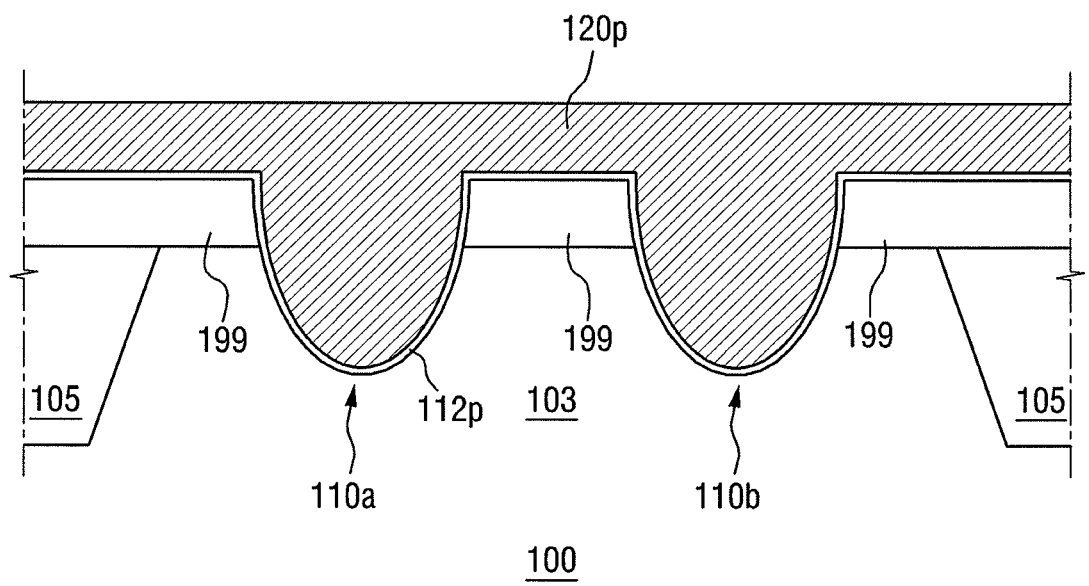

Referring to FIGS. 8 and 13, an electrode material 120p may be formed to cover the insulation layer 112p.

The electrode material 120p may include a conductive material, for example, a metal or polysilicon.

Figure 14:
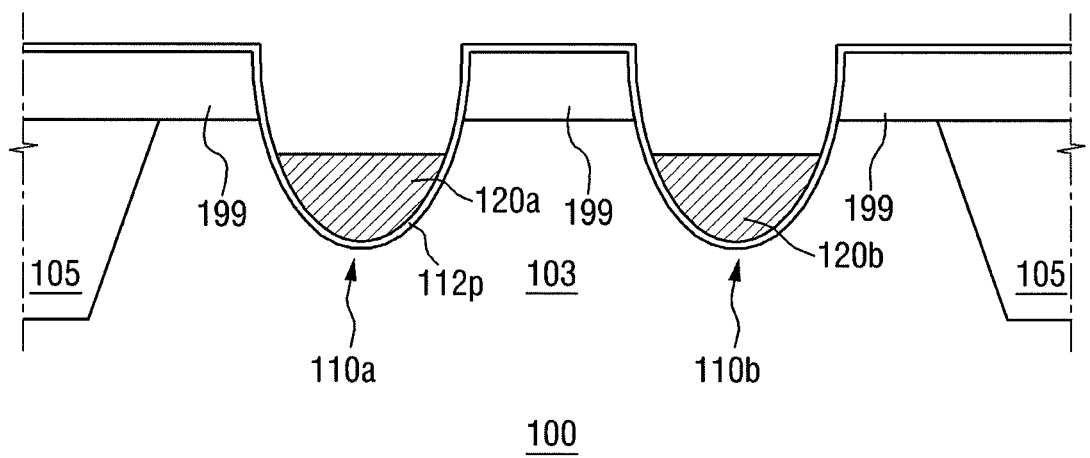

Referring to FIGS. 8 and 14, a first gate electrode 120a and a second gate electrode 120b may be formed by etching the electrode material 120p to fill at least portions of the first trench 110a and the second trench 110b.

The gate electrode 120 may be recessed. A top surface of the gate electrode 120 may be lower than a (top) surface of the substrate 100. The etching may be, for example, an etch back process (S820).

Figure 15:
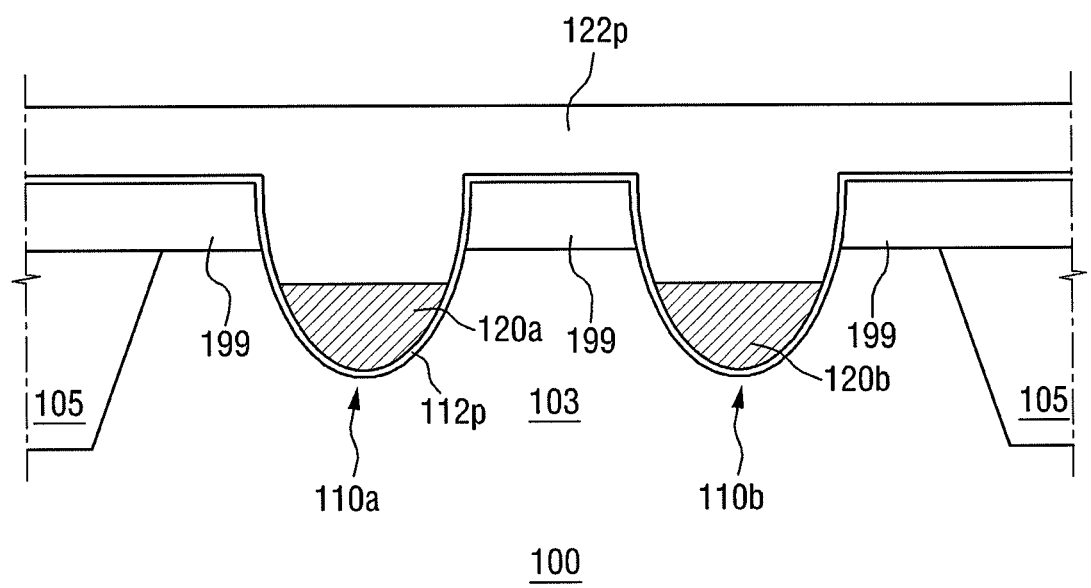

Referring to FIGS. 8 and 15, a capping material 122p may be formed on the first gate electrode 120a and the second gate electrode 120b to fill the first trench 110a and the second trench 110b.

The capping material 122p may include, for example, at least one of silicon oxide, silicon nitride and silicon oxynitride.

Figure 16:
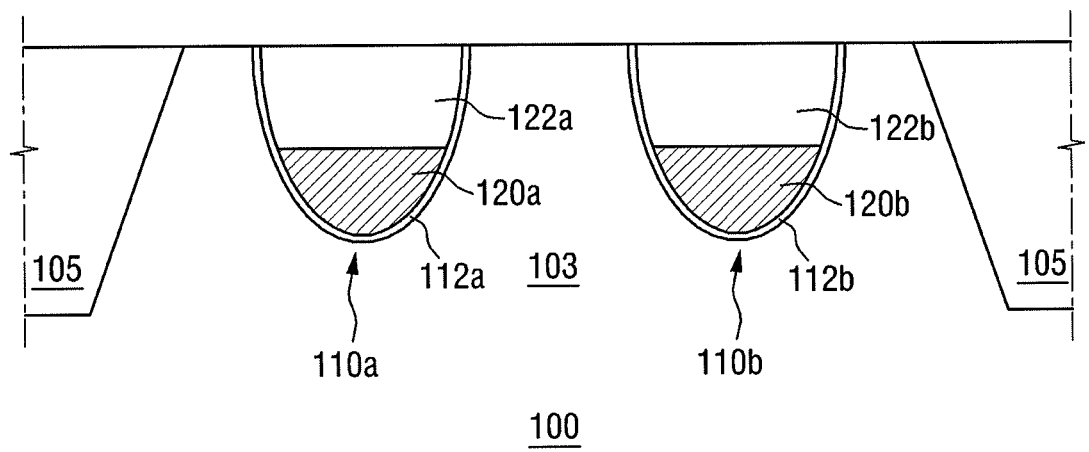

Referring to FIGS. 8 and 16, the capping material 122p, the insulation layer 112p and the mask pattern 199 may be etched to expose the top surface of the substrate 100.

The etching may be, for example, chemical mechanical polishing (CMP), the capping material 122p may form the first capping pattern 122, and the insulation layer 112p may form the first gate insulation layer 112a and the second gate insulation layer 112b. The first gate insulation layer 112a and the second gate insulation layer 112b may be formed only in the first trench 110a and the second trench 110b, respectively. The mask pattern 199 may be entirely removed. All of exposed top surfaces of the capping material 122p, the first gate insulation layer 112a, the second gate insulation layer 112b, the first active region 103 and the device isolation layer 105 may be positioned to be coplanar.

Figure 17:
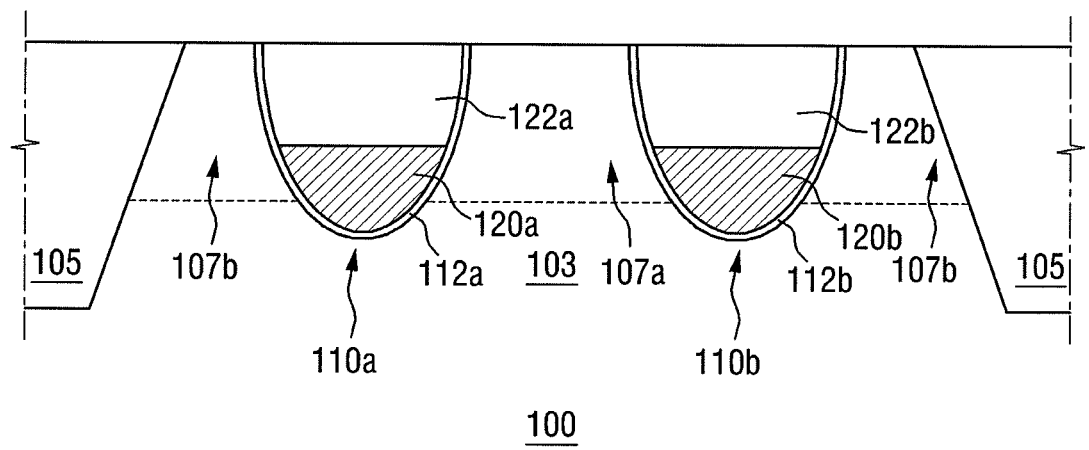

Referring to FIGS. 8 and 17, a first source/drain 107a and a second source/drain 107b may be formed in the first active region 103.

A semiconductor device may be an N type transistor, and the first source/drain 107a may be formed by doping N type impurity. A semiconductor device is an N type transistor, and the second source/drain 107b may be formed by doping N type impurity. The first source/drain 107a may be disposed between the first trench 110a and the second trench 110b in the substrate 100. The second source/drain 107b may be disposed between the first trench 110a and the device isolation layer 105 and between the second trench 110b and the device isolation layer 105 in the substrate 100. The first source/drain 107a may be shared by two adjacent transistors, while the second source/drain 107b may not be shared by two adjacent transistors. As shown, the first source/drain 107a and the second source/drain 107b may be formed to overlap with portions of the first gate electrode 120a and the second gate electrode 120b.

Figure 18:
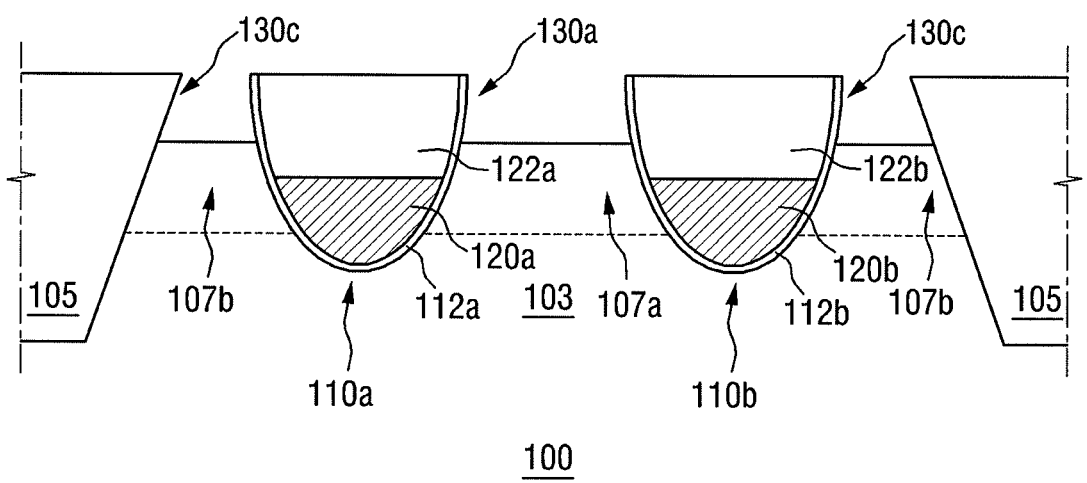

Referring to FIGS. 8 and 18, a first recess 130a may be formed between the first trench 110a and the trench 110b in the first source/drain 107a.

The fifth recess 130c may be formed on the first active region 103. One sidewall of the fifth recess 130c may correspond to the first gate insulation layer 112a or the second gate insulation layer 112b. The other sidewall of the fifth recess 130c may correspond to the device isolation layer 105. A bottom surface or the other sidewall of the fifth recess 130c may be formed in the first active region 103.

Figure 19:
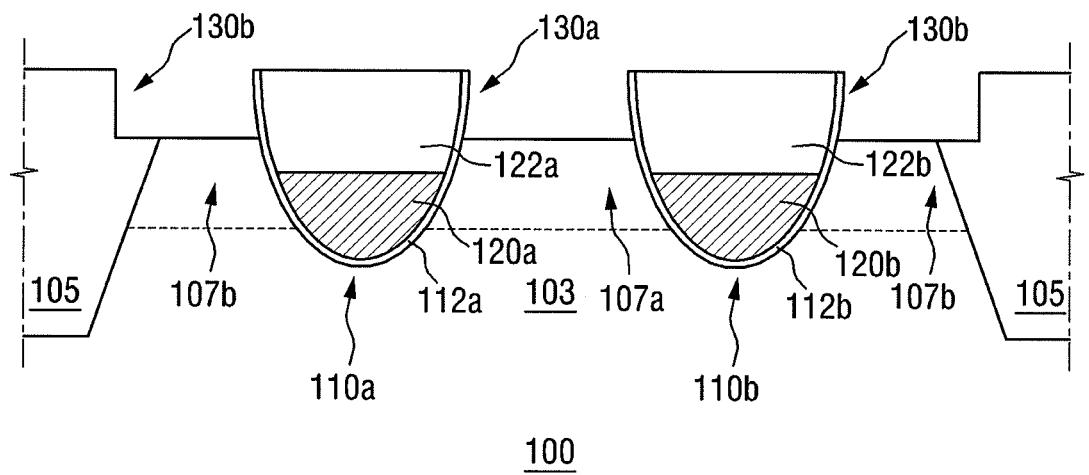

Referring to FIGS. 8 and 19, the second recess 130b may be formed by extending the sidewall of the fifth recess 130c (S830).

A second recess 130b may be formed over a portion of the device isolation layer 105 and the first active region 103 by removing a portion of the device isolation layer 105 corresponding to the one sidewall of the fifth recess 130c.

In an embodiment illustrated in FIG. 19, the second recess 130b may not extend up to the capping pattern 122. The second recess 130b may extend up to the capping pattern 122 by removing portions of the first gate insulation layer 112a and the second gate insulation layer 112b and a portion of the capping pattern 122.

In an embodiment illustrated in FIGS. 18 and 19, the first active region 103 may first be etched to form the fifth recess 130c and the device isolation layer 105 may then be etched to form the second recess 130b. The device isolation layer 105 be first be etched to form the fifth recess 130c and the first active region 103 may then be etched to form the second recess 130b.

The sidewall of the fifth recess 130c may be extended using, for example, a chemical oxide removal (COR) process. In the COR process, a surface of the device isolation layer 105 may be finely etched by dry cleaning using a chemical reaction, and the surface of the device isolation layer 105 may be etched by adsorbing $NH_3$ or HF. The COR process may be performed at a temperature of, e.g., 25° C. to 40° C.

Figure 20:
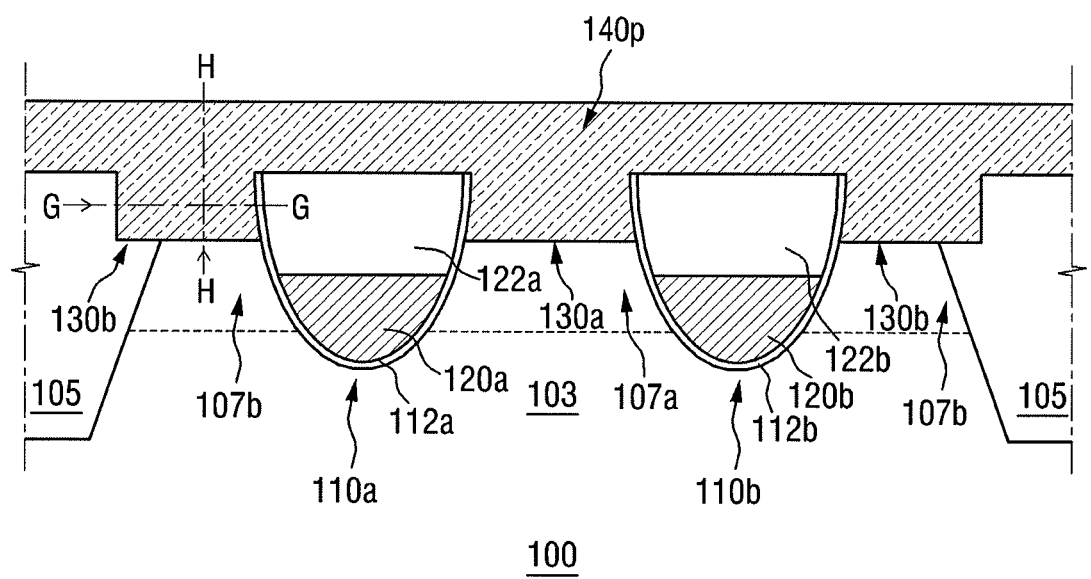

Referring to FIGS. 8 and 20, a lower contact layer 140p may be formed to cover the first recess 130a, the second recess 130b and the top surface of the substrate.

The lower contact layer 140p may include, for example, at least one of polysilicon, a metal silicide compound, conductive metal nitride, and a metal. In describing the fabricating method of the semiconductor device 1 according to the first embodiment, it is assumed that the lower contact layer 140p includes polysilicon. The lower contact layer 140p may include carbon. If the lower contact layer 140p includes carbon, impurity diffusion may be prevented, and the reliability of the semiconductor device may be improved. When the lower contact layer 140p includes phosphorus (P) doped polysilicon, the reliability of the semiconductor device may be deteriorated, for example, due to diffusion of phosphorus (P). In order to prevent the diffusion of phosphorus (P), various methods may be used. The diffusion of phosphorus (P) may be prevented by using carbon doped polysilicon.

In a case of depositing the lower contact layer 140p with carbon (C) doped polysilicon, a first seed layer of carbon (C) doped polysilicon may first be deposited on a bottom surface and lateral surfaces of the second recess 130b, and a second seed layer of carbon (C) doped polysilicon may then be deposited. The first seed layer may have a higher carbon concentration than the second seed layer, and a carbon concentration of a surface of the second lower contact plug 140b may be reduced away from the surface. For example, in a case of the fourth lower contact plug 540b, the carbon concentration may decrease and then may increase along line G-G. In addition, the carbon concentration may gradually decrease and may then be maintained at a constant value from a particular part upwardly along line H-H.

Figure 21:
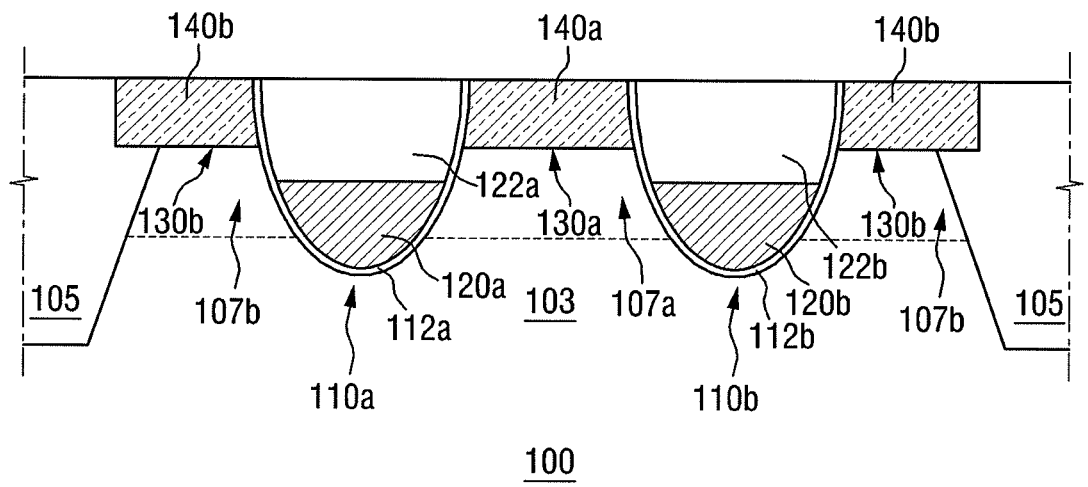

Referring to FIGS. 8 and 21, the lower contact layer 140p covering the top surface of the substrate 100 may be removed, and the second lower contact plug 140b may be formed.

The lower contact layer 140p may be removed until the top surface of the substrate 100 is exposed, and the second lower contact plug 140b may be formed. The removing of the lower contact layer 140p until the top surface of the substrate 100 is exposed may be performed by chemical mechanical polishing (CMP). After the CMP, the top surface of the device isolation layer 105 and the top surfaces of the first lower contact plug 140a and the second lower contact plug 140b may be positioned to be coplanar (S840).

As used herein, the term "coplanar" may encompasses a small step difference between the top surfaces of the first lower contact plug 140a and the second lower contact plug 140b and the top surface of the device isolation layer 105.

Figure 22:
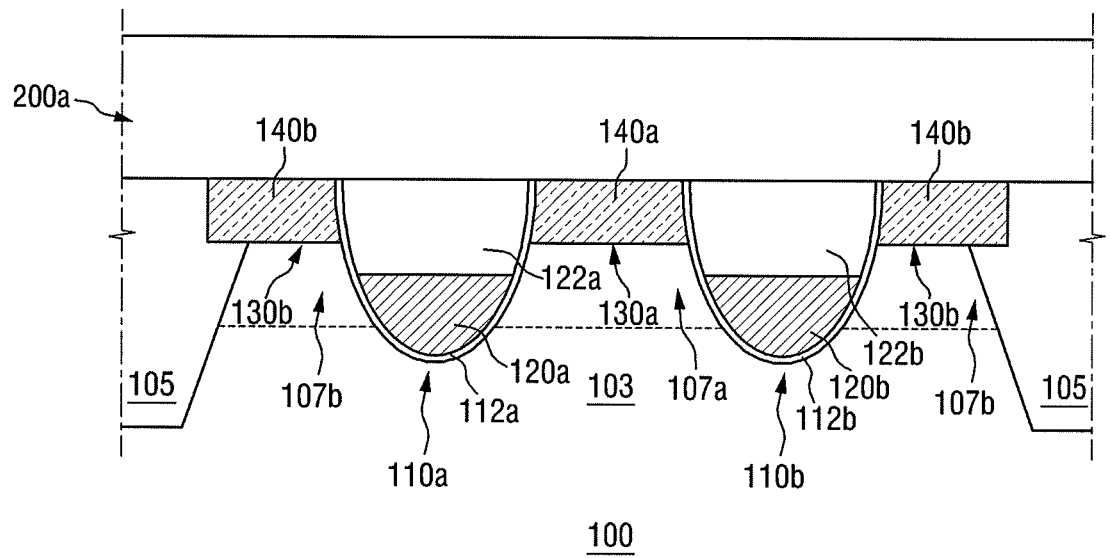

Referring to FIGS. 8 and 22, a first interlayer dielectric film 200a may be formed on a top surface of the substrate 100.

The first interlayer dielectric film 200a may include, for example, at least one of silicon oxide, silicon nitride and silicon oxynitride. The first interlayer dielectric film 200a may include a single layer or multiple layers.

Figure 23:
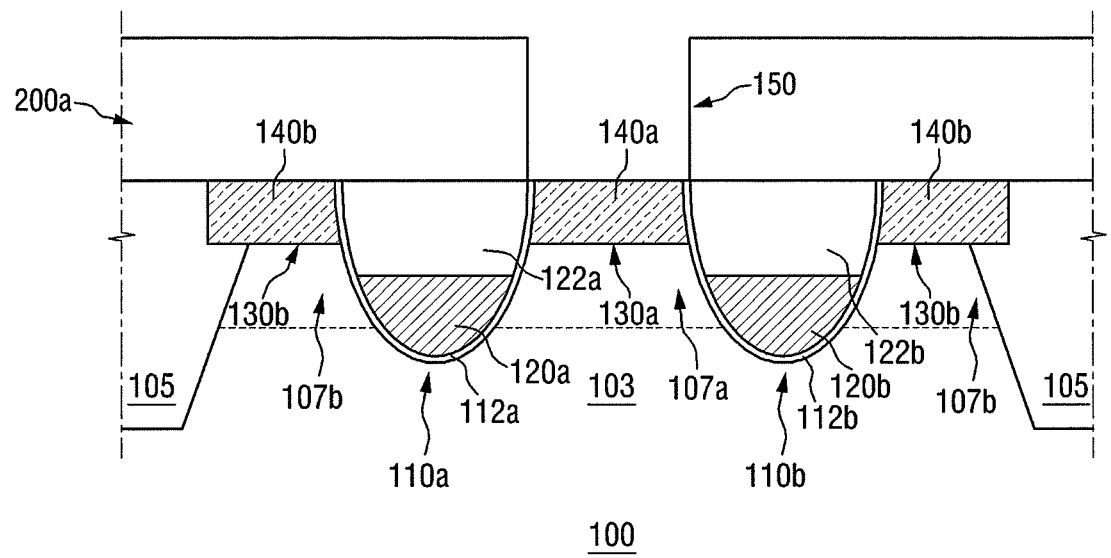

Referring to FIGS. 8 and 23, the first interlayer dielectric film 200a may include a first contact hole 150 exposing the first lower contact plug 140a.

In an embodiment illustrated in FIG. 23, the first contact hole 150 may entirely expose the first lower contact plug 140a.

Figure 24:
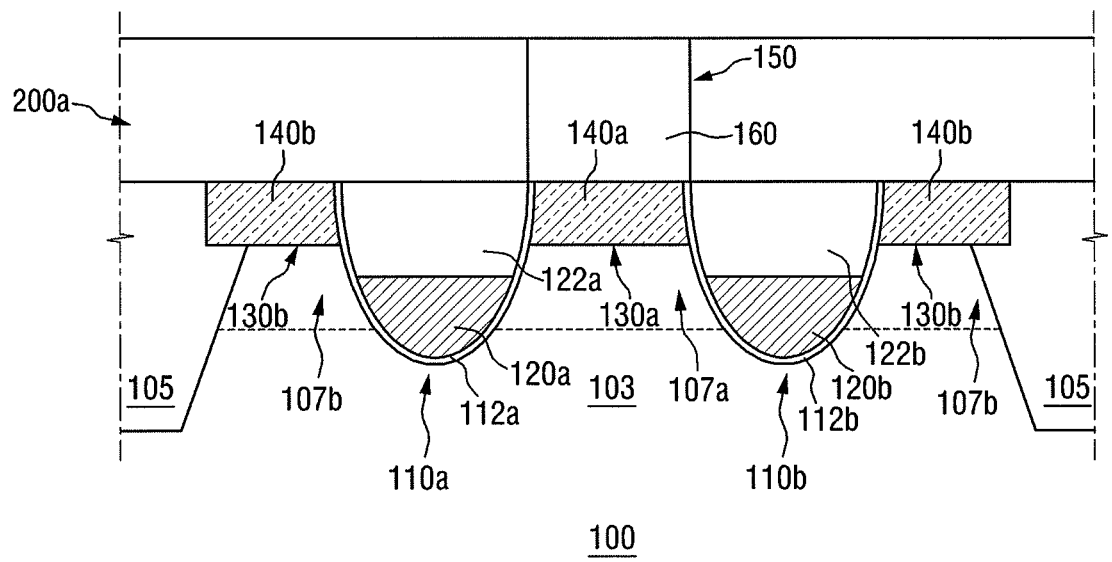

Referring to FIGS. 8 and 24, a first bit line contact 160 may be formed in the first contact hole 150.

The first bit line contact 160 may include a conductive material. The first bit line contact 160 may include, for example, at least one of polysilicon, a metal silicide compound, conductive metal nitride, and a metal.

Figure 25:
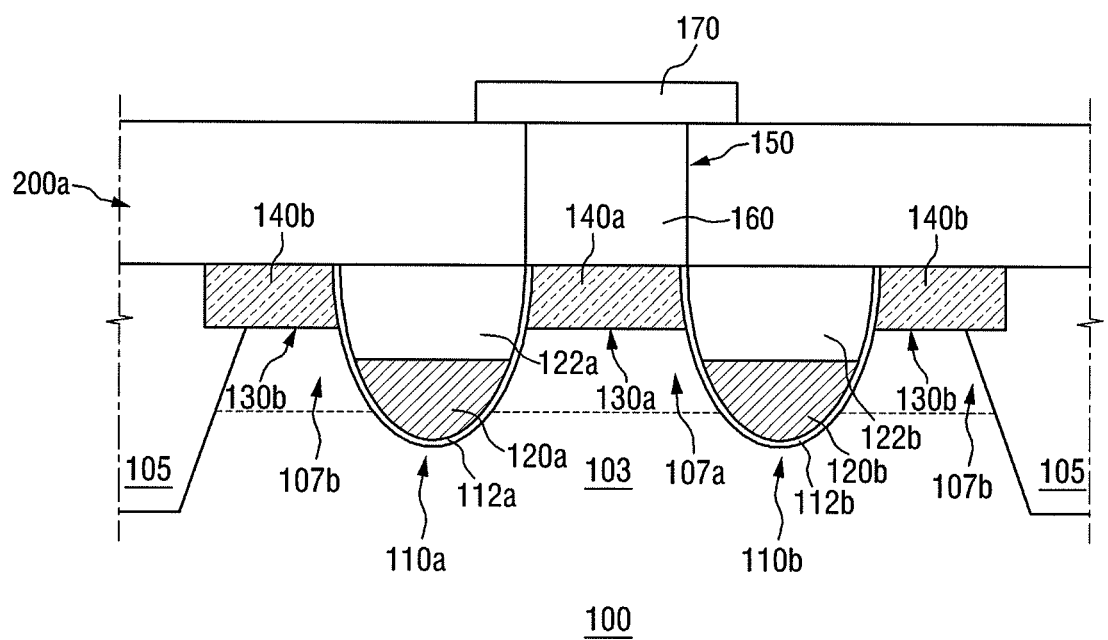

Referring to FIGS. 8 and 25, the first bit line 170 may be electrically connected to the first bit line contact 160 and may be formed on the first bit line contact 160.

The first bit line 170 may include a conductive material. The first bit line 170 may include, for example, at least one of polysilicon, a metal silicide compound, conductive metal nitride, and a metal.

Figure 26:
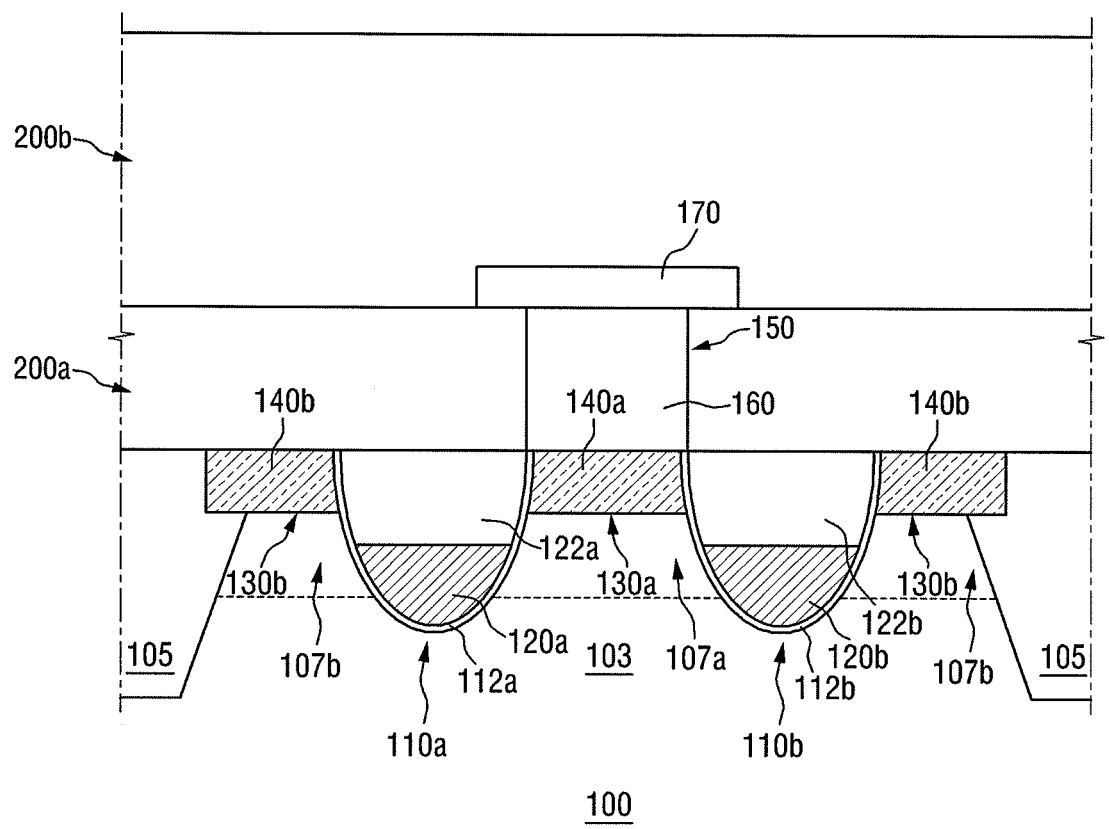

Referring to FIGS. 8 and 26, the second interlayer dielectric film 200b may be formed on the substrate 100 to cover the first bit line 170 (S850).

The second interlayer dielectric film 200b may include, for example, at least one of silicon oxide, silicon nitride and silicon oxynitride. The second interlayer dielectric film 200b may include a single layer or multiple layers.

Figure 27:
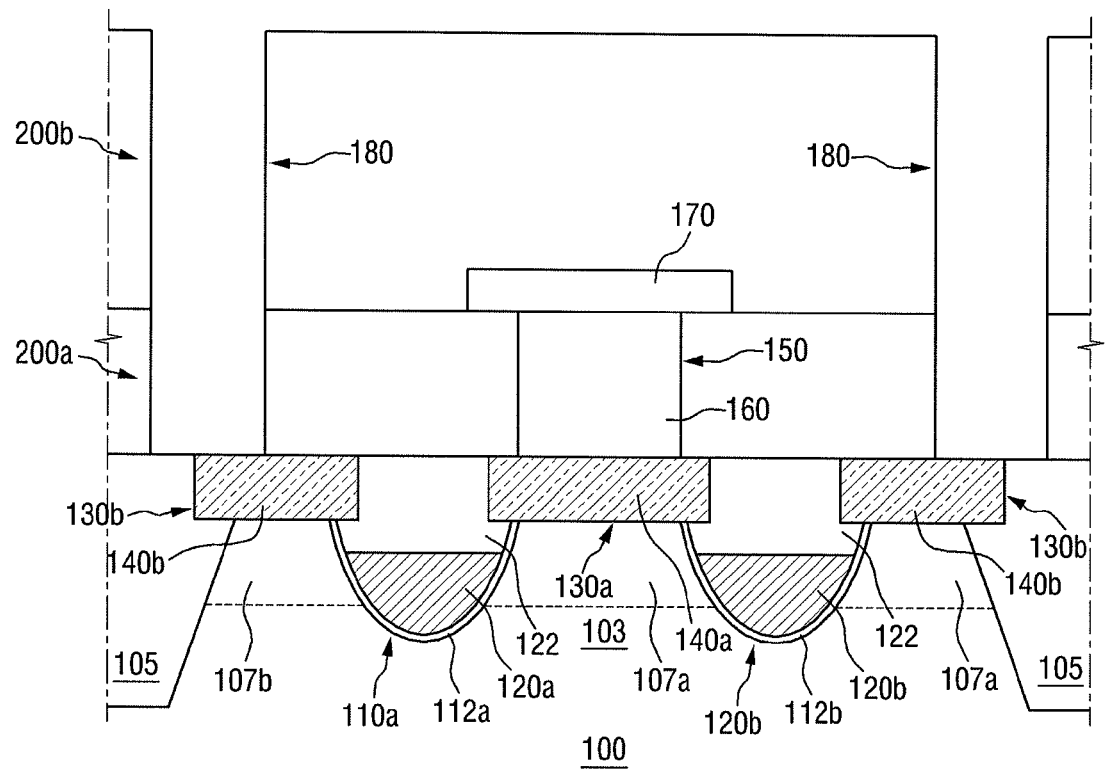

Referring to FIGS. 8 and 27, a second contact hole 180 may pass through the first interlayer dielectric film 200a and the second interlayer dielectric film 200b, and may be formed in the first interlayer dielectric film 200a and the second interlayer dielectric film 200b (S860).

The second contact hole 180 may pass through the first interlayer dielectric film 200a and the second interlayer dielectric film 200b, and may expose the second lower contact plug 140b.

Figure 28:
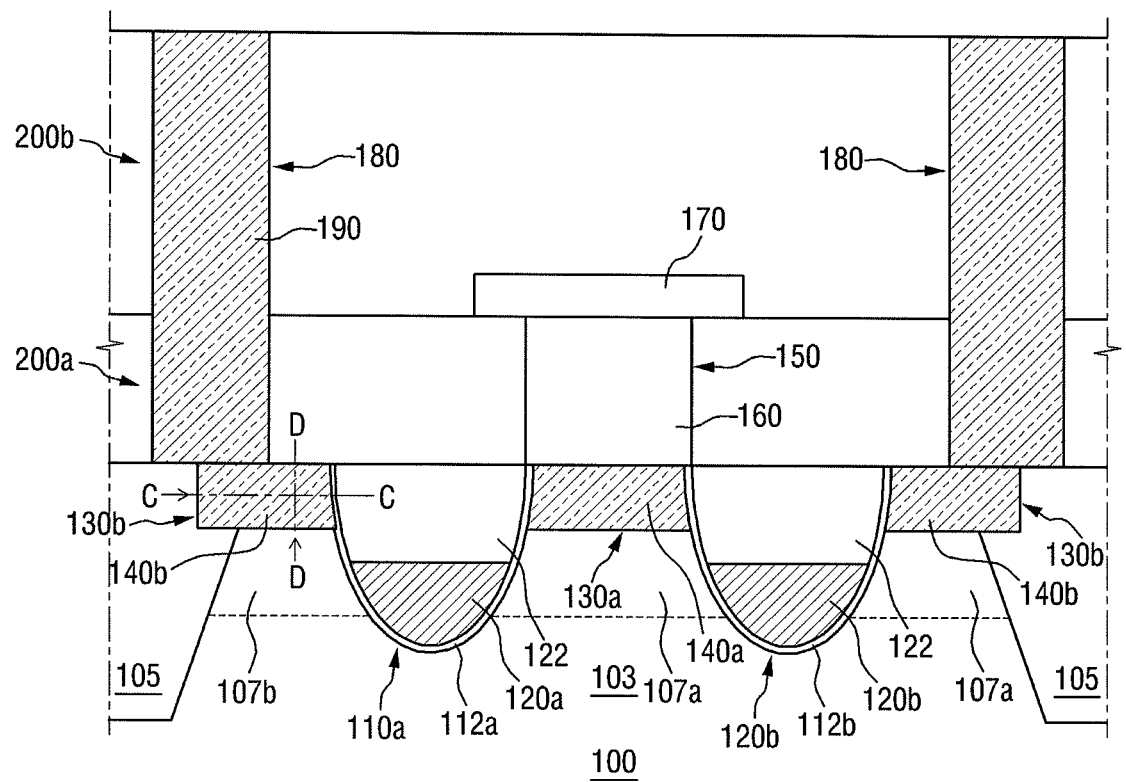

Referring to FIGS. 8 and 28, a first upper contact plug 190 may be formed in the second contact hole 180 (S870).

The first upper contact plug 190 may be electrically connected to the second lower contact plug 140b. The first upper contact plug 190 may include a conductive material. The first upper contact plug 190 may include, for example, at least one of polysilicon, a metal silicide compound, conductive metal nitride, and a metal. The contact plugs 140b and 190 may be formed for the purpose of electrically connecting the second source/drain 107b.

A contact plug that is not divided into an upper part and a lower part may be formed to overlap with a source/drain. If such an individual contact plug is misaligned, for example, due to a processing reason, the reliability of the semiconductor device may be deteriorated.

In the semiconductor device 1 according to the first embodiment, the second lower contact plug 140b may be formed on the second source/drain 107b. The second lower contact plug 140b may be formed along a portion of the device isolation layer 105 as well as on the second source/drain 107b, even if the first upper contact plug 190 is misaligned, it may be electrically connected, and the reliability of the semiconductor device 1 according to the first embodiment may be improved. In an embodiment illustrated in FIG. 28, the first upper contact plug 190 may lean toward the device isolation layer 105.

The contact plugs 190 and 140b may be formed divided into upper and lower parts, and generation of voids may be prevented, as compared to a case of forming an individual contact plug through a single process. The voids are empty spaces created when conformal substance is inserted into a contact hole, and are also called air gaps. If the voids are generated, resistance of the contact plug may increase and the reliability of the semiconductor device may be deteriorated. In the semiconductor device 1 according to the first embodiment, upper and lower contact plugs may be separately formed, and the voids may be prevented from being generated and the reliability may be improved.

Figure 29:
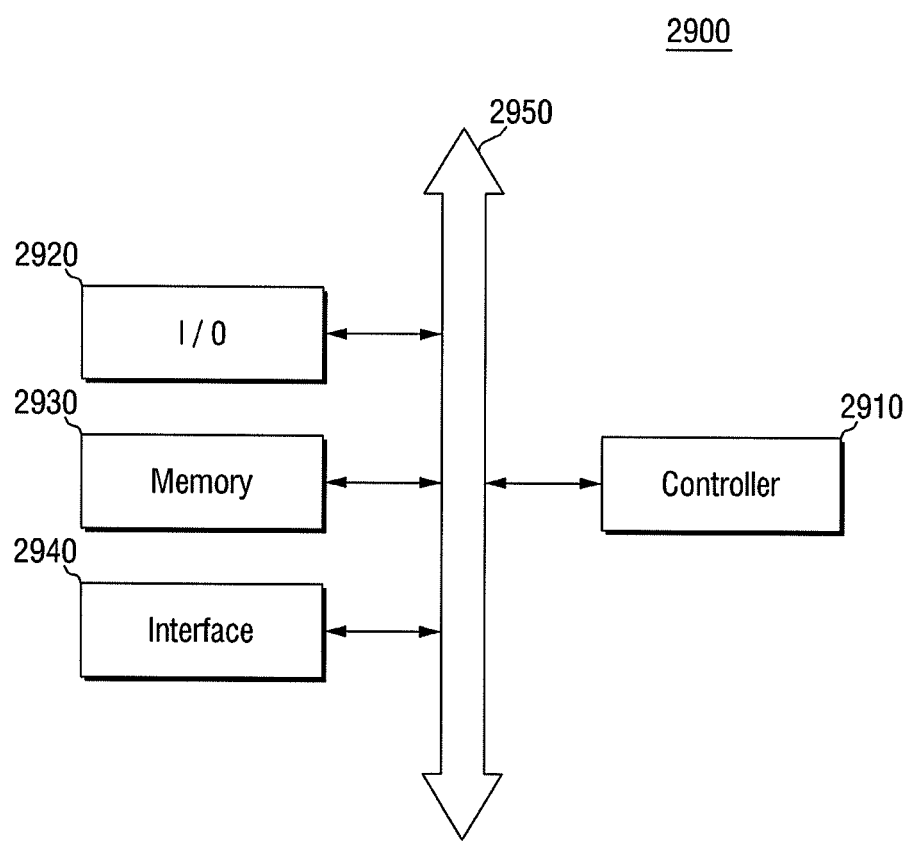
FIG. 29 illustrates a block diagram of an exemplary electronic system including semiconductor devices fabricated according to the fabricating methods according to some embodiments.

FIG. 29 illustrates a block diagram of an exemplary electronic system including semiconductor devices fabricated according to the fabricating methods according to some embodiments.

Referring to FIG. 29, the electronic system 2900 may include a controller 2910, an input/output device (I/O) 2920, a memory device 2929, an interface 2940 and a bus 2950. The controller 2910, the I/O 2920, the memory device 2929, and/or the interface 2940 may be connected to each other through the bus 2950. The bus 2950 may correspond to a path through which data moves.

The controller 2910 may include at least one of a microprocessor, a digital signal processor, a microcontroller, and logic elements capable of functions similar to those of these elements. The I/O 2920 may include a touch screen, a key pad, a key board, a display device, and so on. The memory device 2929 may store data and/or codes. The memory device 2929 may include semiconductor devices according to some embodiments. The memory device 2929 may include DRAM (Dynamic Random-Access Memory). The interface 2940 may perform functions of transmitting data to a communication network or receiving data from the communication network. The interface 2940 may be wired or wireless. For example, the interface 2940 may include an antenna or a wired/wireless transceiver, and so on.

The electronic system 2900 may be applied to a personal digital assistant (PDA), a portable computer, a web tablet, a wireless phone, a mobile phone, a digital music player, a memory card, any type of electronic device capable of transmitting and/or receiving information in a wireless environment, etc.

Figure 30:
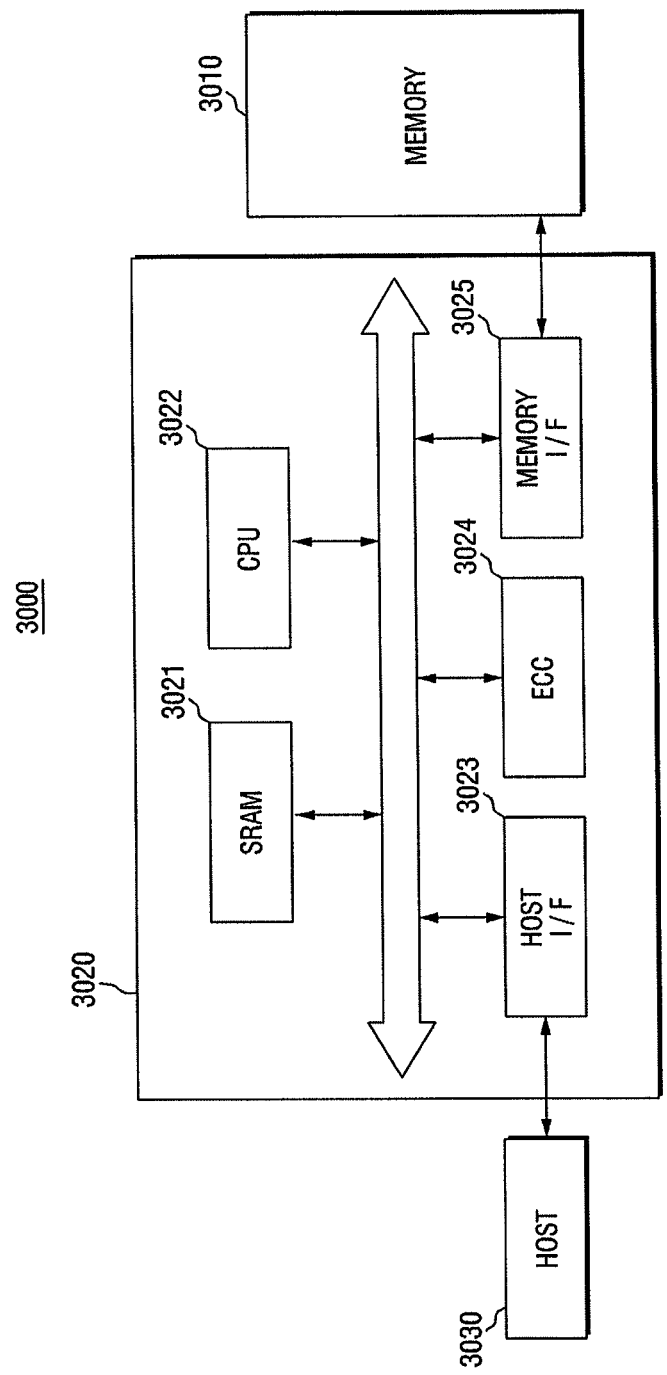
FIG. 30 illustrates a block diagram of an exemplary memory card including semiconductor devices fabricated according to the fabricating methods according to embodiments.

FIG. 30 illustrates a block diagram of an exemplary memory card including semiconductor devices fabricated according to the fabricating methods according to embodiments.

Referring to FIG. 30, the memory 3010 including semiconductor devices fabricated according to the fabricating methods according to various embodiments may be employed for the memory card 3000. The memory card 3000 may include a memory controller 3020 controlling data exchange between a host 3030 and the memory 3010. An SRAM (Static Random-Access Memory) 3021 may be used as a working memory of the CPU 3022. A host interface (I/F) 3023 may use a protocol for the host 3030 to connect to the memory card 3000 for exchanging data. The error correction code (ECC) 3024 may be used to detect and correct an error of data read from the memory 3010.

The memory I/F 3025 may interface with the memory 3010 to exchange data. The CPU 3022 may control the overall operation of the memory controller 3020.

Figure 31:
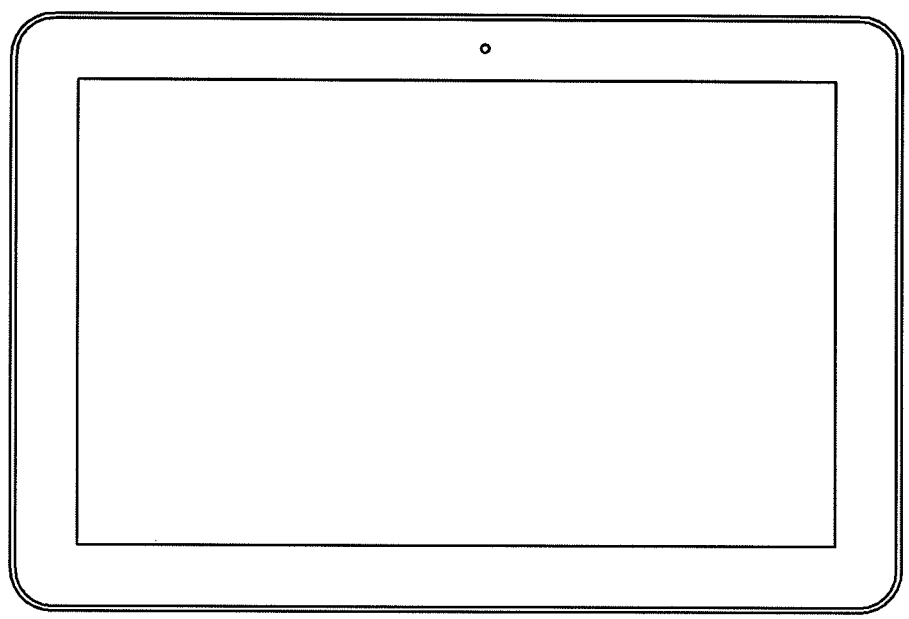
FIGS. 31 and 32 illustrate exemplary semiconductor systems to which semiconductor devices according to some embodiments can be applied.
Figure 32:
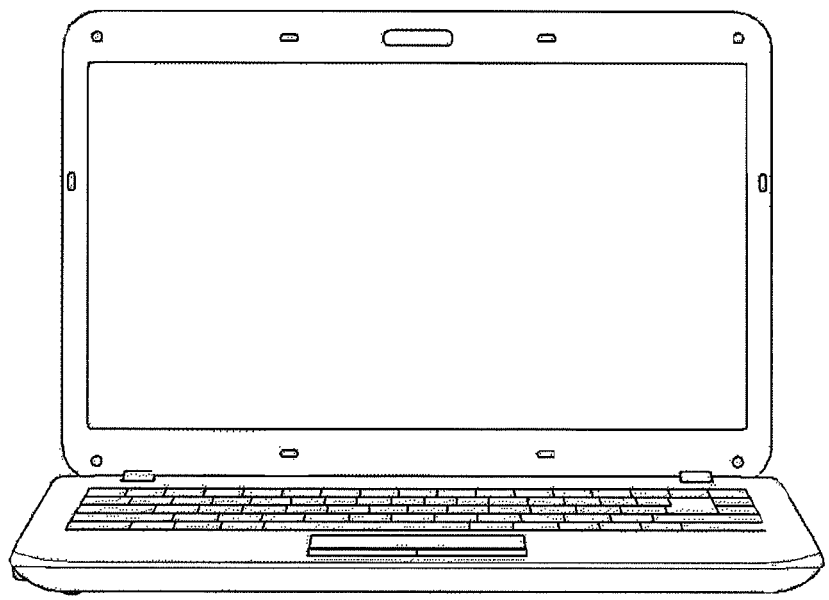

FIGS. 31 and 32 illustrate exemplary semiconductor systems to which semiconductor devices according to embodiments can be applied.

FIG. 31 illustrates an example in which a semiconductor device according to an embodiment is applied to a tablet PC, and FIG. 32 illustrates an example in which a semiconductor device according to an embodiment is applied to a notebook computer. The semiconductor devices according to embodiments may be applied to other IC devices not illustrated herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a device isolation layer and an active region isolated by the device isolation layer, the active region extending in a first horizontal direction such that a length of the active region in the first horizontal direction is longer than a width of the active region in a second horizontal direction perpendicular to the first horizontal direction;
a trench in the active region;
a gate electrode filling at least a portion of the trench;
a recess in the substrate at one side of the trench, the recess overlapping a portion of the device isolation layer and the active region; and
a lower contact plug filling the recess, wherein
the portion of the device isolation layer is adjacent to an end portion of the active region in the first horizontal direction.

2. The semiconductor device as claimed in claim 1, wherein a top surface of the lower contact plug, a top surface of a capping pattern on the gate electrode, and a top surface of the substrate are coplanar.

3. The semiconductor device as claimed in claim 1, further comprising a capping pattern on a top surface of the gate electrode and filling any remaining portion of the trench, wherein the recess overlaps a portion of the capping pattern.

4. The semiconductor device as claimed in claim 1, wherein the lower contact plug contacts the trench.

5. The semiconductor device as claimed in claim 1, further comprising an upper contact plug on the lower contact plug.

6. The semiconductor device as claimed in claim 5, wherein the upper contact plug and the lower contact plug are different materials.

7. The semiconductor device as claimed in claim 6, wherein the lower contact plug includes carbon doped polysilicon and the upper contact plug includes a metal.

8. The semiconductor device as claimed in claim 5, wherein the lower contact plug includes carbon doped polysilicon and the upper contact plug includes polysilicon.

9. The semiconductor device as claimed in claim 1, wherein
the one side of the trench is curved/tilted in a vertical direction orthogonal to the first horizontal direction, and wherein
the recess is adjacent along the curved/tilted one side of the trench.

10. A semiconductor device, comprising:
a substrate including a device isolation layer and first and second active regions isolated by the device isolation layer;
a first trench in the first active region and a second trench in the second active region;
a first gate electrode filling at least a portion of the first trench and a second gate electrode filling at least a portion of the second trench;
a first recess in the substrate at one side of the first gate electrode, the first recess overlapping a portion of the device isolation layer and the first active region;
a second recess in the substrate at one side of the second gate electrode, the second recess overlapping a portion of the device isolation layer and the second active region;
a first lower contact plug filling the first recess; and
a second lower contact plug filling the second recess and separated from the first lower contact plug.

11. The semiconductor device as claimed in claim 10, wherein a portion of the device isolation layer is interposed between the first lower contact plug and the second lower contact plug.

12. The semiconductor device as claimed in claim 10, wherein a top surface of the first lower contact plug, a top surface of the second lower contact plug and a top surface of the substrate are coplanar.

13. The semiconductor device as claimed in claim 10, wherein the first lower contact plug contacts the first trench and the second lower contact plug contacts the second trench.

14. The semiconductor device as claimed in claim 10, further comprising:

a third trench in the device isolation layer; and a conductive material filling a portion of the third trench, wherein at least one of the first lower contact plug and the second lower contact plug overlaps with the conductive material.

15. The semiconductor device as claimed in claim 10, further comprising:

an interlayer dielectric film on the substrate;

a first contact hole passing through the interlayer dielectric film and exposing the first lower contact plug and a second contact hole passing through the interlayer dielectric film and exposing the second lower contact plug; and a first upper contact plug in the first contact hole and a second upper contact plug in the second contact hole.

16. The semiconductor device as claimed in claim 15, wherein:

the first upper contact plugs and the first lower contact plugs are different materials; and the second upper contact plugs and the second lower contact plugs are different materials.

17. A semiconductor device, comprising:

a substrate including a device isolation layer and an adjacent source/drain region of an active region;

a recess in a portion of the device isolation layer and the source/drain region;

a lower contact plug filling the recess and formed directly on the source/drain region; and a storage node overlapping a portion of the lower contact plug.

18. The semiconductor device as claimed in claim 17, further comprising:

a trench in the active region, the recess being at one side of the trench; and a gate insulation layer in the trench.

19. The semiconductor device as claimed in claim 18, wherein the lower contact plug overlaps a portion of the gate insulation layer.

20. The semiconductor device as claimed in claim 19, wherein the lower contact plug overlaps all of the gate insulation layer.

21. The semiconductor device as claimed in claim 19, further comprising:

a gate electrode filling a portion of the trench; and a capping pattern on a top surface of the gate electrode and filling a remaining portion of the trench, the lower contact plug overlapping a portion of the capping pattern.

* * * * *